United States Patent
Tsuzuki et al.

(10) Patent No.: US 6,469,598 B2
(45) Date of Patent: Oct. 22, 2002

(54) SAW FILTER WITH UNIDIRECTIONAL TRANSDUCER AND COMMUNICATION APPARATUS USING THE SAME

(75) Inventors: Shigeru Tsuzuki, Osaka (JP); Tsutomu Igaki, Hyogo (JP); Kazunori Nishimura, Kyoto (JP); Ken Matsunami, Kyoto (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 09/803,771

(22) Filed: Mar. 12, 2001

(65) Prior Publication Data

US 2002/0125970 A1 Sep. 12, 2002

(51) Int. Cl.$^7$ ................................ H03H 9/64
(52) U.S. Cl. ................... 333/193; 310/313 B
(58) Field of Search ............... 333/193–196; 310/313 R, 313 B, 313 C, 313 D

(56) References Cited

U.S. PATENT DOCUMENTS

| | | | |
|---|---|---|---|
| 4,162,465 A | | 7/1979 | Hunsinger et al. ........... 333/151 |
| 5,831,492 A | * | 11/1998 | Solie ........................ 333/193 |
| 5,896,071 A | * | 4/1999 | Dai et al. .................... 333/193 |
| 6,075,426 A | * | 6/2000 | Tsutsumi et al. ............ 333/193 |
| 6,211,600 B1 | * | 4/2001 | Martin ..................... 310/313 D |
| 6,246,150 B1 | * | 6/2001 | Mitobe .................... 310/313 B |

FOREIGN PATENT DOCUMENTS

| | | | | |
|---|---|---|---|---|
| JP | 54-17647 | * | 2/1979 | ............. 333/194 |
| JP | 61-6917 | * | 1/1986 | ............. 333/193 |
| JP | 11-330895 | * | 11/1999 | |

OTHER PUBLICATIONS

P. Ventura et al., "A New Concept in SPUDT Design: The RSPUDT (Resonant SPUDT)", *1994 IEEE Proceedings Ultrasonics Symposium*, vol. 1, pp. 1–6, Nov. 1994.*
H. Nakamura et al., A Practical SPUDT Design for SAW Filters with Different–Width Split–Finger Interdigital Transducers, this paper appears in *IEEE 2000 Ultrasonics Symposium*, vol. 1, pp. 105–108, Oct. 2000.

* cited by examiner

Primary Examiner—Robert Pascal
Assistant Examiner—Barbara Summons
(74) Attorney, Agent, or Firm—RatnerPrestia

(57) ABSTRACT

A surface acoustic wave (SAW) filter is disclosed which comprises a piezoelectric substrate and at least two Interdigital Transducers (IDTs) having four fingered electrodes in a region corresponding to one-wavelength of SAW excited on the piezoelectric substrate. At least one IDT is formed of at least one pair of fingered electrodes having different electrode widths. By provision of the pair of fingered electrodes being different in electrode width, the IDT can be given unidirectionality. Thus, a SAW filter producing a low insertion loss and having good amplitude and phase characteristics in the pass-band can be realized. Further, by using such SAW filter, a high-performance and low-cost communication apparatus, such as a CDMA-system mobile telephone, can be realized.

12 Claims, 23 Drawing Sheets

Substrate: Quartz
Center frequency: 111.9MHz
Number of pair electrodes: 25 pairs (both IN/OUT)

Thickness
□ 1500 Å
○ 3000 Å
△ 4700 Å
◇ 6000 Å
× 9000 Å

Center frequency: 111.85MHz
Insertion loss: 8.17dB
Bandwidth(-5dB): 1.29MHz

Center frequency: 111.85MHz
Insertion loss: 13.25dB
Bandwidth(-5dB): 1.28MHz

SAW FILTER WITH UNIDIRECTIONAL TRANSDUCER AND COMMUNICATION APPARATUS USING THE SAME

FIELD OF THE INVENTION

The present invention relates to an acoustic surface wave filter for use in high-frequency circuits or the like of a radio communication apparatus and, more particularly, relates to an surface acoustic wave filter of a transversal type utilizing a unidirectional interdigital transducer and a radio communication apparatus using the same.

BACKGROUND OF THE INVENTION

Surface acoustic wave filter (hereinafter called SAW filter) is a small and thin filter using Surface Acoustic Wave (hereinafter called SAW) excited on a piezoelectric substrate. The SAW filter is in practical use as a small and thin key component for mobile communication apparatuses such as mobile telephones.

SAW filters are broadly classified into transversal type filters and resonator type filters. When it is required to have a relatively broad bandwidth and flat phase characteristics in the pass-band as with IF filters for mobile telephones of Code Division Multiple Access (CDMA) system, SAW filters of the transversal type are being used. However, since a transversal type SAW filter produces a large insertion loss, there is a measure for reducing such a loss by adapting Interdigital Transducer (hereinafter called IDT) to be unidirectional.

Furthermore, unidirectional IDTs are broadly classified into those of multi-phase type and single-phase type. Especially, those of single-phase type are used widely because of its simple structure.

One of the prior art examples of the same is shown in FIG. 23A and FIG. 23B.

FIG. 23A is its top view and FIG. 23B is an enlarged view of a portion of FIG. 23A surrounded by an oblong solid line.

IDT shown in FIG. 23A and FIG. 23B is a kind of Electrode Width Controlled Single Phase Unidirectional Transducer (EWC-SPUDT). It is structured such that its basic component, when the wavelength of the SAW is denoted by $\lambda$, has a total of three fingered electrodes 100a, 100b disposed in a region of one wavelength ($\lambda$) on a piezoelectric substrate, of which one fingered electrode 100a has an electrode width of $\lambda/4$ and two other fingered electrodes 100b each have an electrode width of $\lambda/8$.

This EWC-SPUDT contains two reflecting electrodes 100a having their centers of reflection in asymmetrical positional relationship with respect to the center of excitation of SAW. Therefore, in one direction in which the excited SAW propagates, it is superposed in phase on the reflected wave and, in the opposite direction, it is superposed out of phase on the reflected wave. Thus, SAW is provided with a propagation directionality.

In the structure shown in FIG. 23A, a relatively strong unidirectionality is obtained in accordance with setting of film thickness of fingered electrodes 100a, 100b and number of pairs of the same, i.e., a directionality toward the right in the drawing is obtained. Further, such a SAW filter has been mainly used by inserting between frequency mixer 83 and IF amplifier 85 in receive system 220 in a transmit-receive circuit of a radio communication apparatus having transmit system 200 and receive system 220 as shown in FIG. 22.

Although such a conventional SAW filter has had a strong unidirectionality, its excitation efficiency has not been sufficiently good. Hence, there has been a problem that both of its insertion loss and its pass-band characteristics are not good enough to be used as a communication filter.

SUMMARY OF THE INVENTION

A SAW filter according to the present invention comprises at least two IDTs having four fingered electrodes disposed in a region on a piezoelectric substrate corresponding to one wavelength of a SAW excited on the piezoelectric substrate. At least one of the IDTs is formed of at least one pair of fingered electrodes having different electrode widths. The pair of fingered electrodes allows the SAW to obtain a unidirectional propagating characteristic on the same principle as in the aforementioned EWC-SPUDT.

A SAW filter having a sufficient unidirectionality, an excellent exciting efficiency and a sufficiently low insertion loss can be obtained by going through for example the following steps.

(a) Arranging two IDTs formed of pair of fingered electrodes having different electrode widths such that unidirectionalities are strengthened in the directions toward each other.

(b) Arranging two IDTs having the same shape in symmetrical positional relationship.

Further, by arranging an IDT including at least one pair of fingered electrodes having different electrode widths such that, in a region including the pair of fingered electrodes, which is one of the regions obtained by equally dividing the IDT having the pair of fingered electrodes such that a division corresponding to one-half wavelength of SAW includes the pair of fingered electrodes, the distance between the fingered electrodes ($\gamma$) is greater than the sum of the distance between the narrower of the fingered electrodes and an edge of the region near the same ($\alpha$) and the distance between the wider of the fingered electrodes and an edge of the region near the same ($\beta$), the ripple inside the pass-band of the SAW filter can be reduced and attenuation outside the pass-band can be increased.

Further, when an IDT has both a pair of fingered electrodes being different in electrode width and a pair of fingered electrodes being the same in electrode width, it is arranged, in the former pair of fingered electrodes, such that the distance between the fingered electrodes ($\gamma$) is greater than the sum of the distance between the narrower of the fingered electrodes and an edge of the region near the same ($\alpha$) and the distance between the wider of the fingered electrodes and an edge of the region near the same ($\beta$) and $\alpha<\beta$. Then, the ripple inside the pass-band of the SAW filter can be reduced and attenuation outside the pass-band can be increased.

Further, pairs of fingered electrode may be arranged such that at least one IDT has a unidirectionality in one direction and at least one region of the IDT has a unidirectionality in the opposite direction. By arranging in such a manner, the size of the IDT can be made smaller than before. Thus, a SAW filter being of a small size and capable of producing a small insertion loss can be obtained.

Further, by taking any of the following steps (a) to (f), a SAW filter controlled for unidirectionality, controlled for the ripple due to insufficient unidirectionality or excessive unidirectionality, and provided with much improved filter characteristics can be obtained.

(a) Electrode width ratio of pair of fingered electrodes of at least one IDT is made different from electrode width ratio of at least one other pair of fingered electrodes of the IDT.

(b) Electrode width ratio of pair of fingered electrodes of at least one IDT is made different from electrode width ratio of at least one other pair of fingered electrodes of the IDT. Further, distance between electrodes of the former pair of fingered electrodes is made different from distance between electrodes of the latter pair of fingered electrodes.

(c) At least one IDT is adapted to have two kinds of pair of fingered electrodes being different in electrode width ratio.

(d) At least one IDT is adapted to have two kinds of pair of fingered electrodes being different in electrode width ratio and distance between electrodes.

(e) Metallization ratio of fingered electrodes is set between 0.4 and 0.7.

(f) Fingered electrodes are formed of aluminum or alloyed aluminum as main component and film thickness ratio is set between 0.005 and 0.035.

Further, a '28°–42° rotated Y-cut' quartz substrate may be used as the piezoelectric substrate to obtain a SAW filter having optimum temperature characteristics within the range of desired operating temperatures.

Further, a SAW filter of the invention may be disposed between a frequency mixer and an IF amplifier of a communication apparatus. Then, the number of amplifying elements of the amplifier can be decreased and power consumption can be reduced to obtain a communication apparatus with high performance at low cost.

A SAW filter as described above can provide sufficient unidirectionality, excellent SAW excitation efficiency and sufficiently low insertion loss, excellent amplitude and phase characteristics inside and outside the pass-band, and good temperature characteristics. By employing the filter in a communication apparatus, high performance and low cost communication apparatus can be realized.

DESCRIPTION OF THE PREFERRED EMBODIMENTS

Preferred embodiments of the present invention will be described below with reference to the accompanying drawings.

(Exemplary Embodiment 1)

Figure 1:
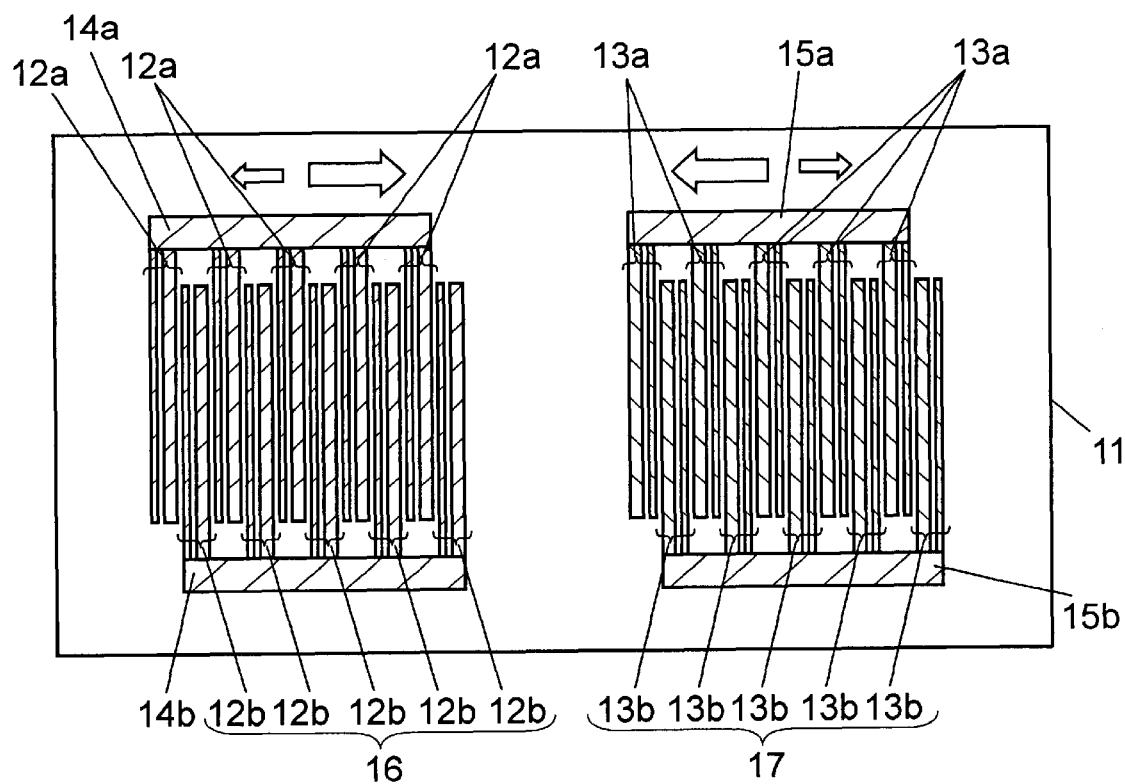
FIG. 1 is a top view of a SAW filter according to embodiment 1 of the invention.

FIG. 1 is a top view of a SAW filter according to the present invention having input IDT 16 and output IDT 17 formed on a piezoelectric substrate 11.

Input IDT 16 and output IDT 17 are each constructed of interdigitated pairs of fingered electrodes 12a and 12b, and 13a and 13b, and lead electrodes 14a and 14b, and 15a and 15b, connecting their respective electrodes. At least a portion of the pairs of fingered electrodes 12a, 12b, 13a, and 13b are formed of fingered electrodes having a different electrode width from others.

In FIG. 1, the small arrow indicates the direction in which the propagation directionality of the SAW is weak and the large arrow indicates the direction in which the propagation directionality of the SAW is strong.

Figure 2A:
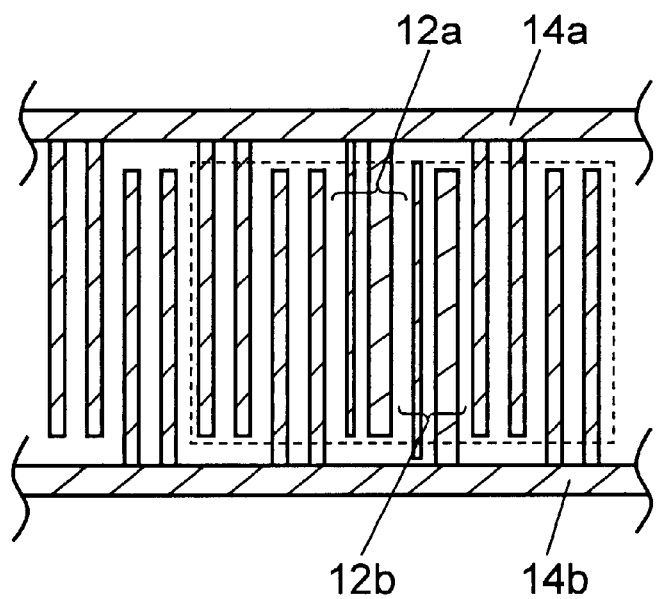
FIG. 2A is a top view of input IDT of the SAW filter shown in FIG. 1.
Figure 2B:
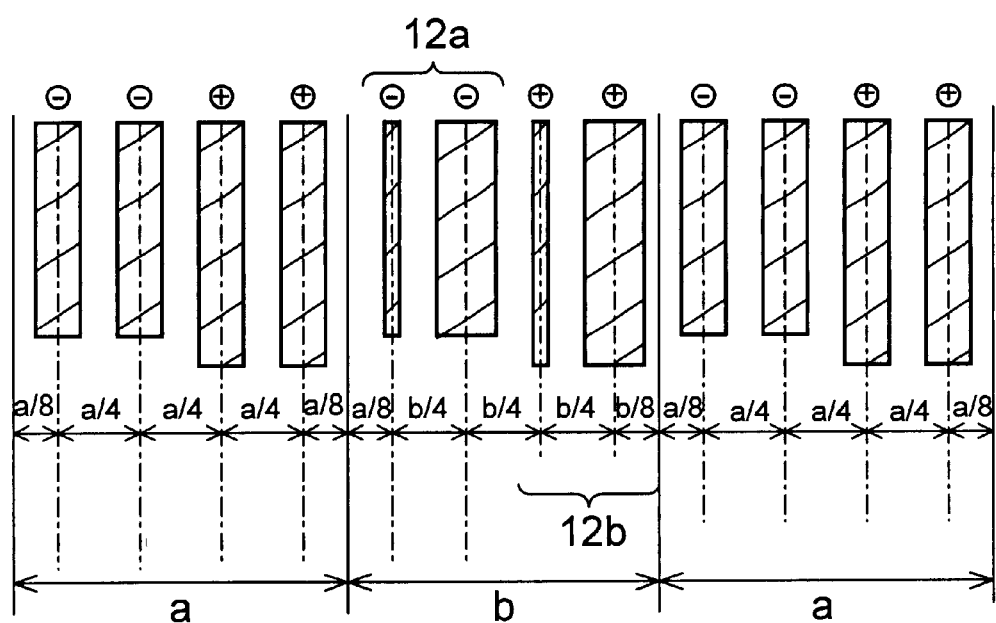
FIG. 2B is an enlarged top view of the portion surrounded by a broken line in FIG. 2A.

FIG. 2A is an enlarged top view of a portion of input IDT 16 and FIG. 2B is an enlarged view of the portion surrounded by a broken line in FIG. 2A.

As piezoelectric substrate 11, a '28°–42° rotated Y-cut' quartz substrate is used. Input IDT 16 and output IDT 17 are formed of aluminum or alloyed aluminum on piezoelectric substrate 11 and disposed, as shown in FIG. 1, such that the propagation directions oppose each other.

Figure 3:
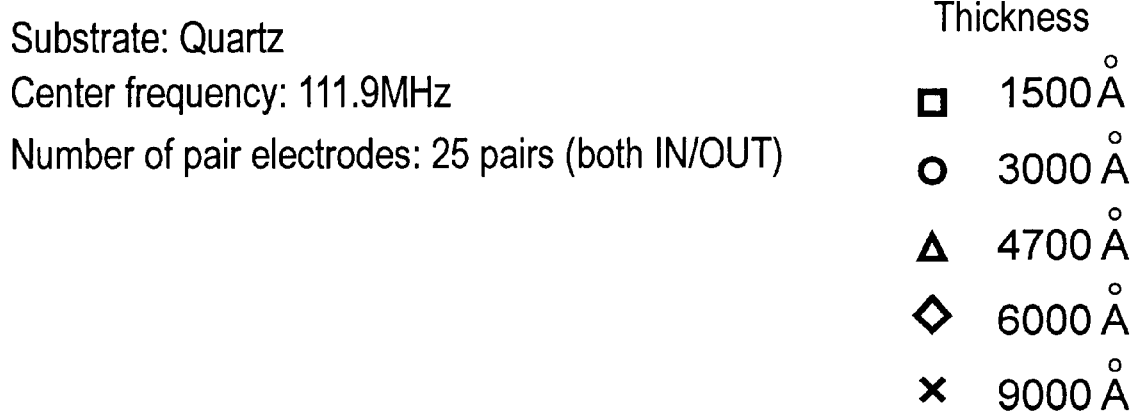
FIG. 3 is a characteristic curve showing relationship between electrode width ratio and insertion loss of the SAW filter according to embodiment 1 of the invention.
Figure 3:
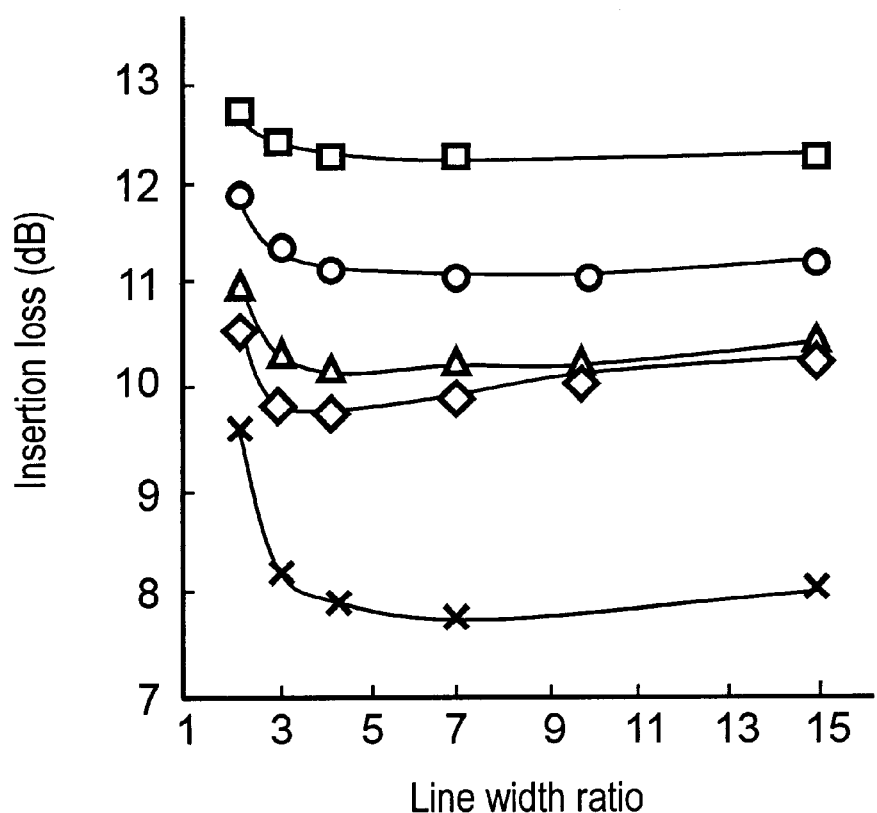

When the numbers of pairs of fingered electrodes 12a and 12b, and 13a and 13b, are each set to be 25 and electrode width ratios are all set to be the same, relationships between electrode width ratio (L2/L1) and insertion loss of SAW filter are shown in FIG. 3, where L1 denotes the electrode width of the narrow fingered electrode of IDT and L2 denotes the electrode width of the wide fingered electrode of IDT.

As a result of experimental studies of electrical characteristics of SAW filter of the described structure, it was ascertained that the unidirectionality of the SAW filter has its maximum value around an electrode width ratio of 3, regardless of the film thicknesses of fingered electrodes 12a, 12b, 13a, and 13b.

It was also ascertained that the insertion loss reaches its minimum value when the electrode width ratio is greater than 3.

However, when the electrode width ratio becomes too large, the width of the narrow fingered electrode becomes so narrow that a problem arises in the fabrication process that they are unsuitable for mass production. For instance, when the center frequency is 111.9 MHz, the electrode width ratio is 7, and the metallization ratio that is defined by the ratio between the sum of electrode widths of fingered electrodes within one-half wavelength region of a SAW and one-half wavelength of the SAW, i.e., $(L1+L2)/(\lambda/2)$, is 0.5, the electrode width of the narrow fingered electrode becomes such a minute value as 0.88 $\mu$m. Then, a problem arises that it is infeasible to fabricate the SAW filter with precision.

Therefore, in order to control the unidirectionality of a SAW, to control the ripple due to group-delay variation in the pass-band caused by an insufficient directionality of the SAW or an excessive directionality of the SAW, in reverse, and to obtain better filter characteristics, the electrode width ratio is set to be greater than 1 or, preferably, within the range from 1.4 to less than 3.6.

An IDT, when its electrode width ratio is 1, is a bidirectional IDT, which has fingered electrodes of an electrode width of $\lambda/8$ and has conventionally been in use. In view of this fact, the effect of low insertion loss produced by the IDT of the structure according to the present invention can be understood from FIG. 3.

Further, in the present invention, the metallization ratio is also a factor largely affecting the insertion loss of a SAW filter. Related behaviors are shown in FIG. 4.

Figure 4:
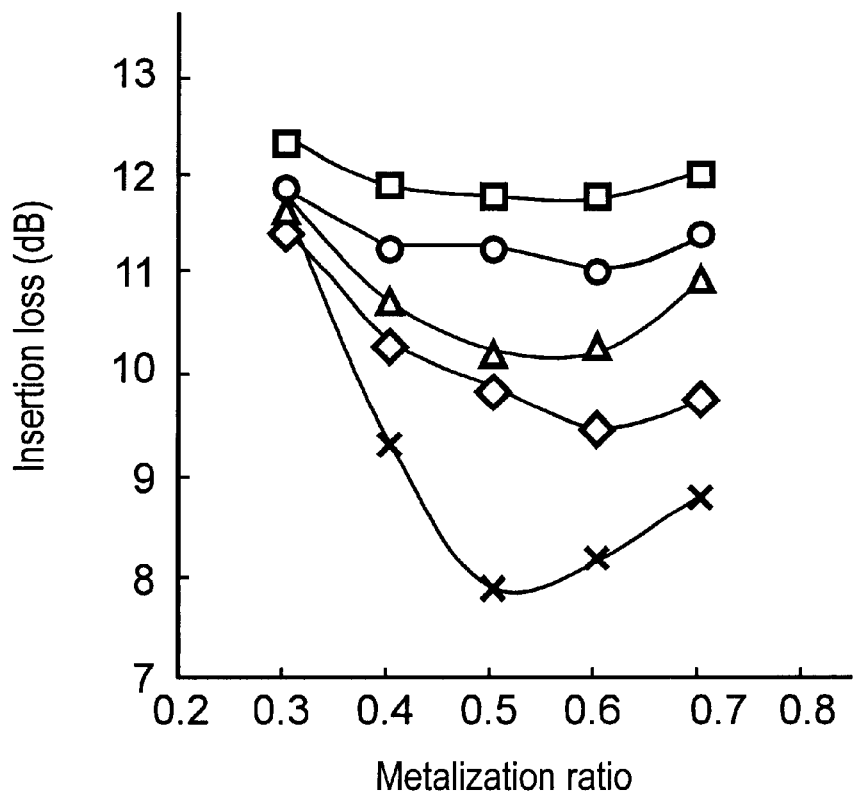
FIG. 4 is a characteristic curve showing relationship between metallization ratio and insertion loss of the SAW filter according to embodiment 1 of the invention.

Although it depends on the film thicknesses of fingered electrodes 12a, 12b, 13a, and 13b to some extent, it is known from FIG. 4 that the insertion loss can be reduced when the metallization ratio is set between 0.4 and 0.7 or, preferably, between 0.5 and 0.6.

Input and output IDT 16 and 17 are made of aluminum or a metal mainly containing aluminum e.g. alloyed aluminum. It is also experimentally known that favorable results can be obtained when the film thickness ratio $(h/\lambda)$ defined by the ratio between the film thickness h of constituent fingered electrodes and the wavelength $\lambda$ of the surface acoustic wave is set between 0.005 and 0.035.

By the configuration of the present embodiment as described above, a SAW filter with a controlled unidirectionality, low insertion loss, and good characteristics in the pass-band can be obtained.

(Exemplary Embodiment 2)

Figure 5:
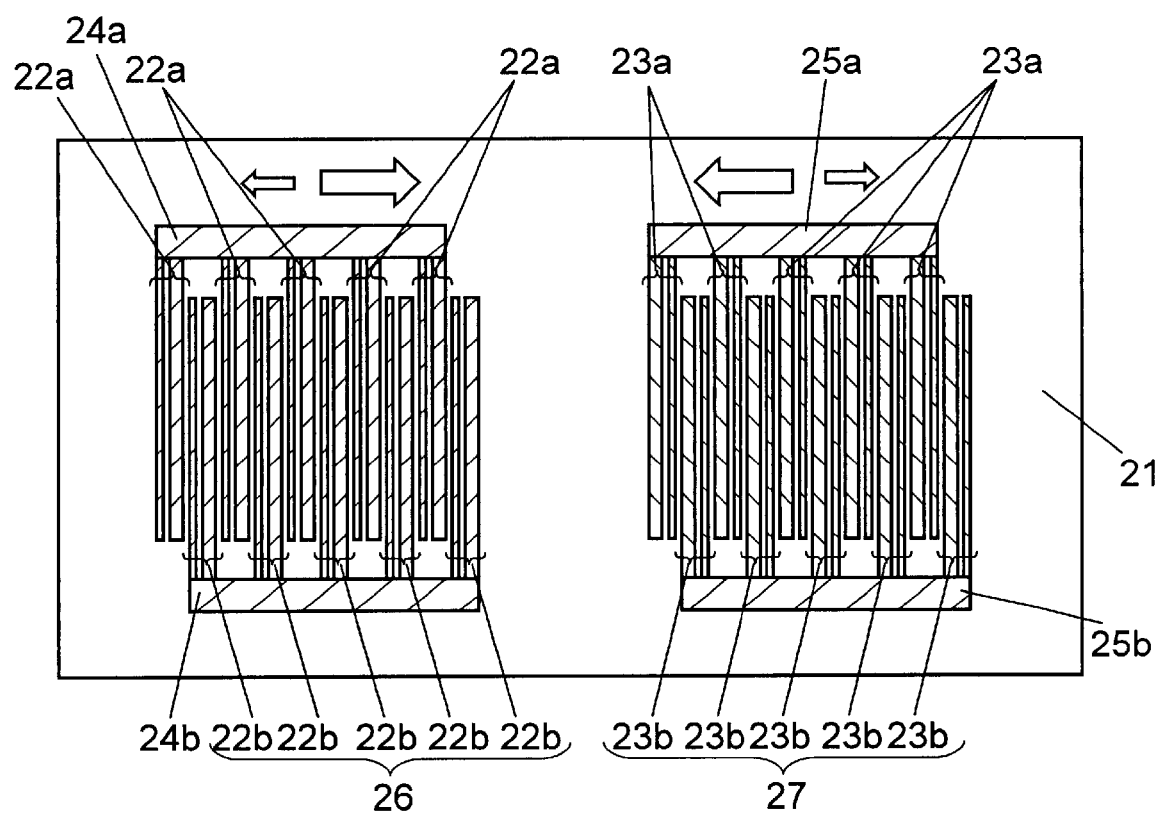
FIG. 5 is a top view of a SAW filter according to embodiment 2 of the invention.
Figure 6:
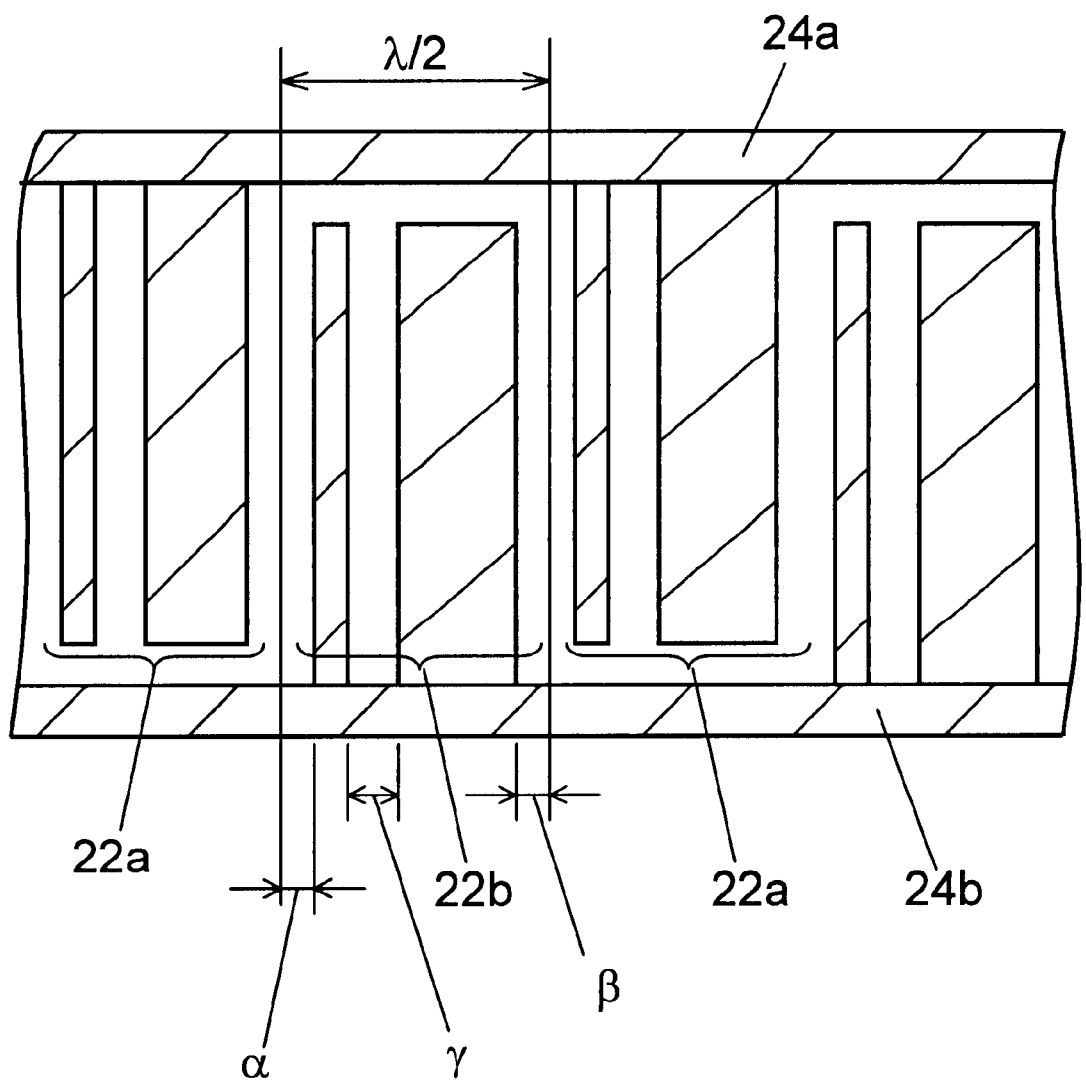
FIG. 6 is an enlarged top view of a main portion of FIG. 5.

FIG. 5 is a top view of a SAW filter according to exemplary embodiment 2 and FIG. 6 is an enlarged top view of a main portion of FIG. 5, in which input IDT 26 and output IDT 27 are formed on piezoelectric substrate 21.

Input IDT 26 and output IDT 27 are constructed of interdigitated pairs of fingered electrodes 22a and 22b, and 23a and 23b, and lead electrodes 24a and 24b, and 25a and 25b, connecting their respective electrodes. The pairs of fingered electrodes 22a and 22b, and 23a and 23b, are constructed of fingered electrodes being different in electrode width.

In FIG. 5, the small arrow indicates the direction in which the propagation directionality of the SAW is weak and the large arrow indicates the direction in which the propagation directionality of the SAW is strong.

Input IDT 26 and output IDT 27, as with exemplary embodiment 1, are made of aluminum or alloyed aluminum.

As shown in FIG. 6, a relation $\gamma > \alpha + \beta$ holds in input IDT 26, where:

(a) $\gamma$ denotes the distance between a narrow fingered electrode and a wide fingered electrode of a pair of fingered electrodes 22b connected to lead electrode 24b, (b) in the region including the pair of fingered electrodes 22b of regions obtained by equally dividing input IDT 26 such that a division corresponding to one-half wavelength of the SAW includes the pair of fingered electrodes 22b,
  i) $\alpha$ denotes the distance between the narrow fingered electrode and the edge of the region near the same, and
  ii) $\beta$ denotes the distance between the wide fingered electrode and the edge of the region near the same.

As with exemplary embodiment 1, the electrode width ratio is set to be larger than 1 or, preferably, within the range from 1.4 to less than 3.6. Further, the metallization ratio is set to be from 0.4 to 0.7 or, preferably, from 0.5 to 0.6. Further, it is preferred that the film thickness ratio of the fingered electrodes constituting input IDT 26 and output IDT 27 be set to be from 0.005 to 0.035.

Figure 7A:
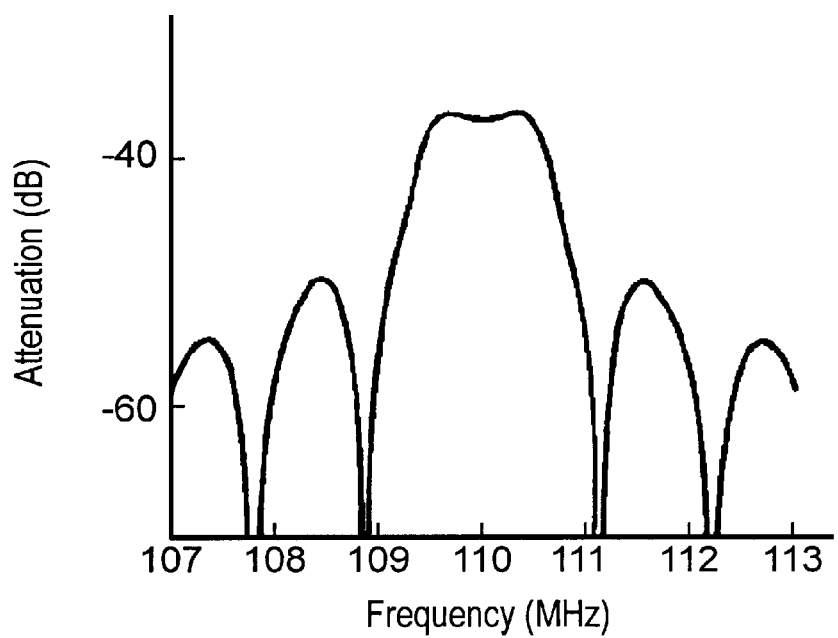
FIG. 7A is a frequency characteristic curve of electromechanical transduction in the direction in which the directionality of the SAW filter according to embodiment 2 of the invention is strong.
Figure 7B:
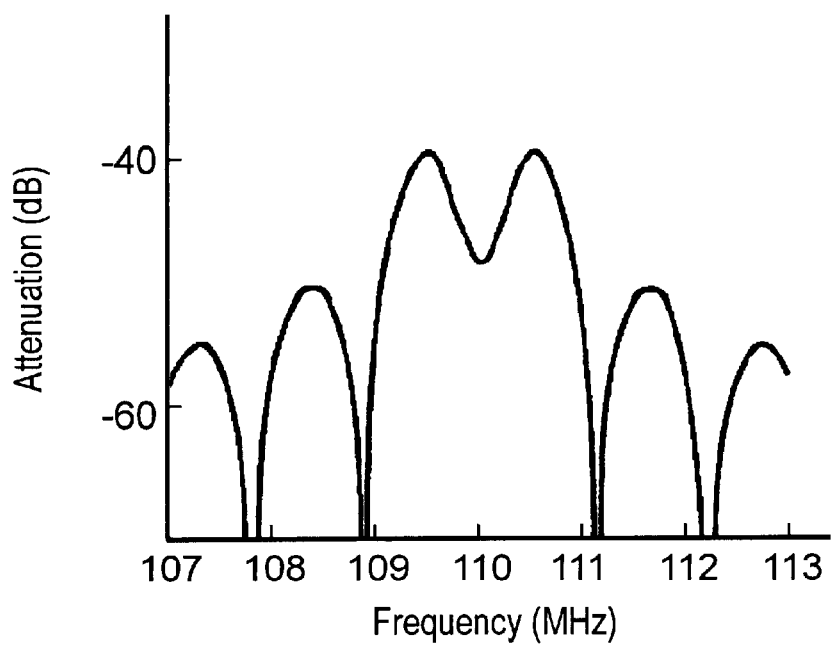
FIG. 7B is a frequency characteristic curve of electromechanical transduction in the direction in which the directionality of the SAW filter according to embodiment 2 of the invention is weak.

FIG. 7A shows frequency characteristics of electromechanical transduction, in a SAW filter formed of an IDT having 100 pairs of fingered electrodes different in electrode width, in the direction in which the directionality of the SAW filter is strong when it is specified such that the film thickness is 0.015, the electrode width ratio is 3, and $\alpha=\beta=0.41\times(\lambda/16)$, and $\gamma=2\times(\lambda/16)$. FIG. 7B shows frequency characteristics of electromechanical transduction in the same SAW filter in the direction in which the directionality is weak.

Figure 8A:
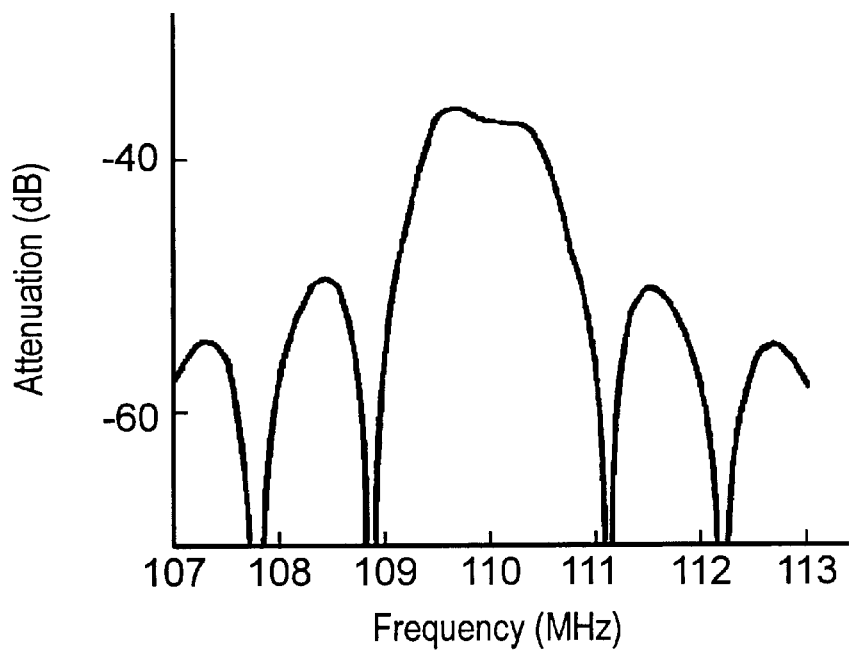
FIG. 8A is a frequency characteristic curve of electromechanical transduction in the direction in which the directionality of a SAW filter of a comparison example is strong.
Figure 8B:
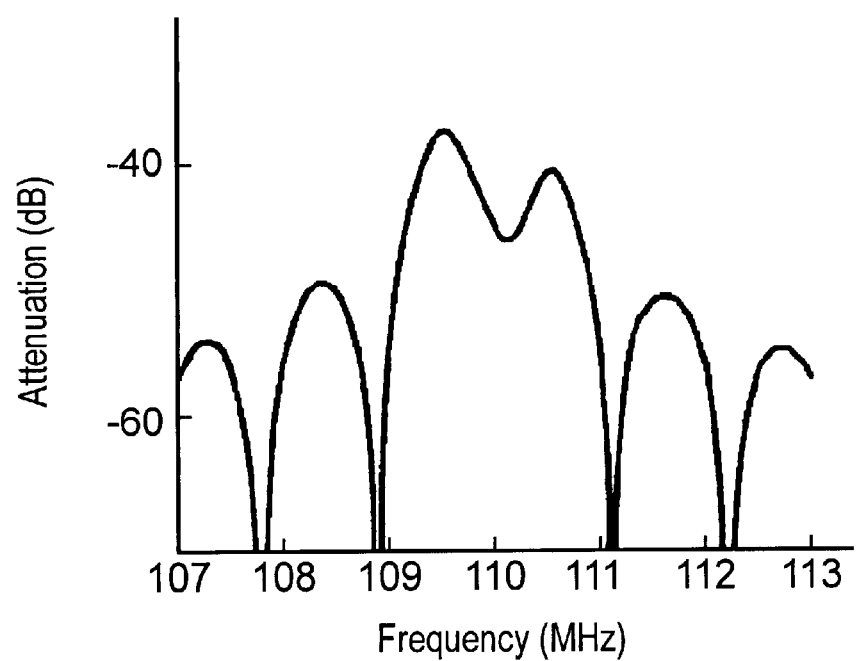
FIG. 8B is a frequency characteristic curve of electromechanical transduction in the direction in which the directionality of the SAW filter of the comparison example is weak.

For the sake of comparison, FIG. 8A shows frequency characteristics of electromechanical transduction, in a SAW filter formed of an IDT having 100 pairs of fingered electrodes being different in electrode width, in the direction in which the directionality of the SAW filter is strong when it is specified such that the film thickness is 0.015, the electrode width ratio is 3, and $\alpha=\beta=1\times(\lambda/16)$, and $\gamma=2\times(\lambda/16)$. FIG. 8B shows frequency characteristics of electromechanical transduction of the same SAW filter in the direction in which the directionality is weak.

As understood from comparison of FIG. 7 with FIG. 8, the present embodiment is excellent in symmetry and, therefore, the variation in the pass-band can be made smaller and the stop-band attenuation can be made greater.

Figure 9:
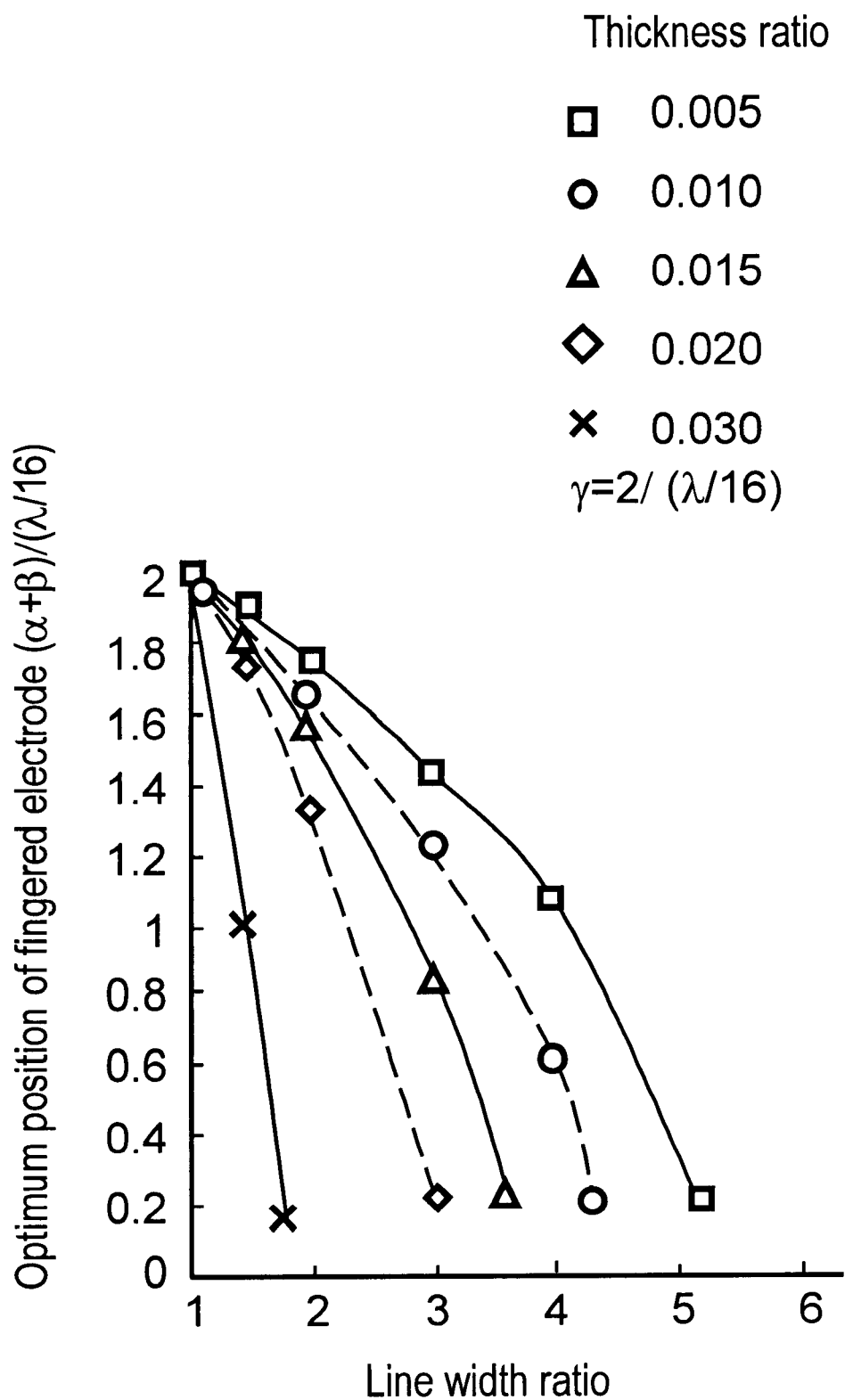
FIG. 9 is a curve showing relationship between electrode width ratio and optimum position of fingered electrodes $[(\alpha+\beta)/(\lambda/16)]$ of the SAW filter according to embodiment 2 of the invention.

FIG. 9 shows optimum values of $\alpha+\beta(<\gamma)$ with respect to film thickness ratios of 0.005, 0.010, 0.015, 0.020, and 0.030 of a SAW filter, which uses a '28°–42° rotated Y-cut quartz' substrate as piezoelectric substrate 21 in FIG.5 and is formed of an IDT having 100 pairs of fingered electrodes, and the center frequency of of which is 110 MHz.

(Exemplary Embodiment 3)

Figure 10:
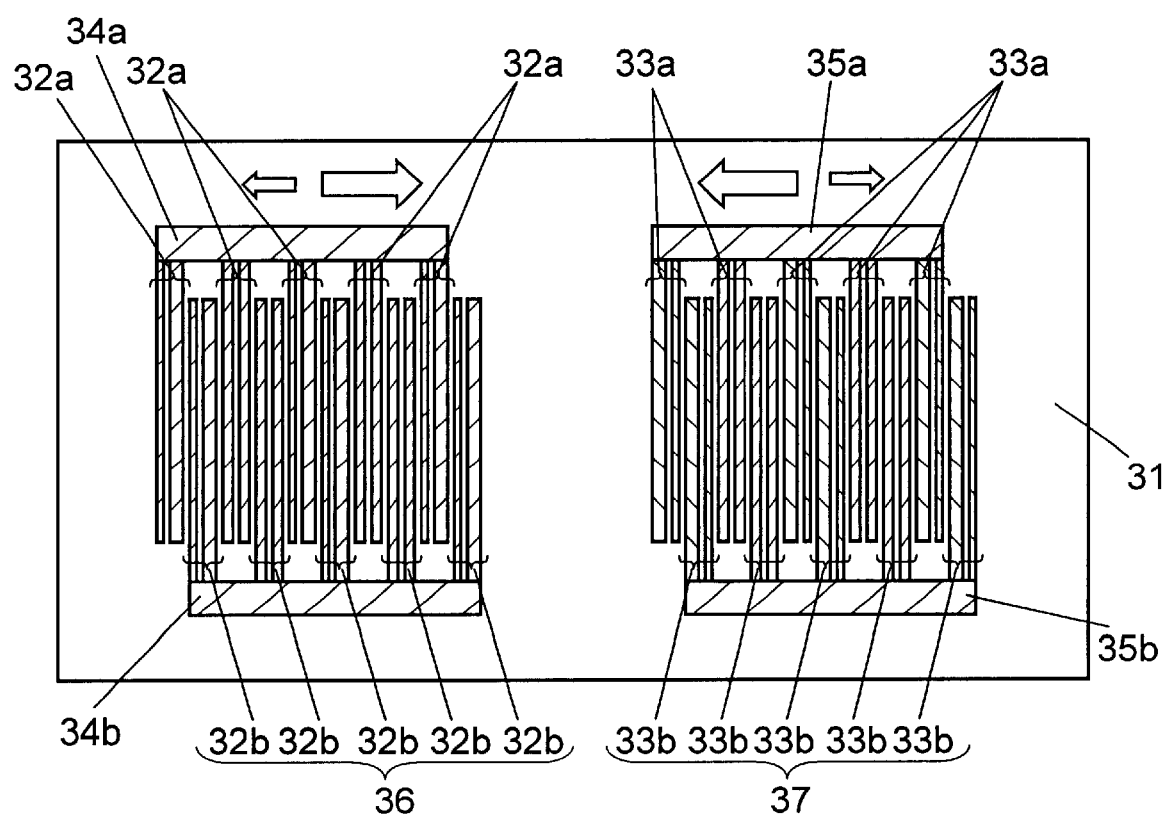
FIG. 10 is a top view of a SAW filter according to embodiment 3 of the invention.
Figure 11:
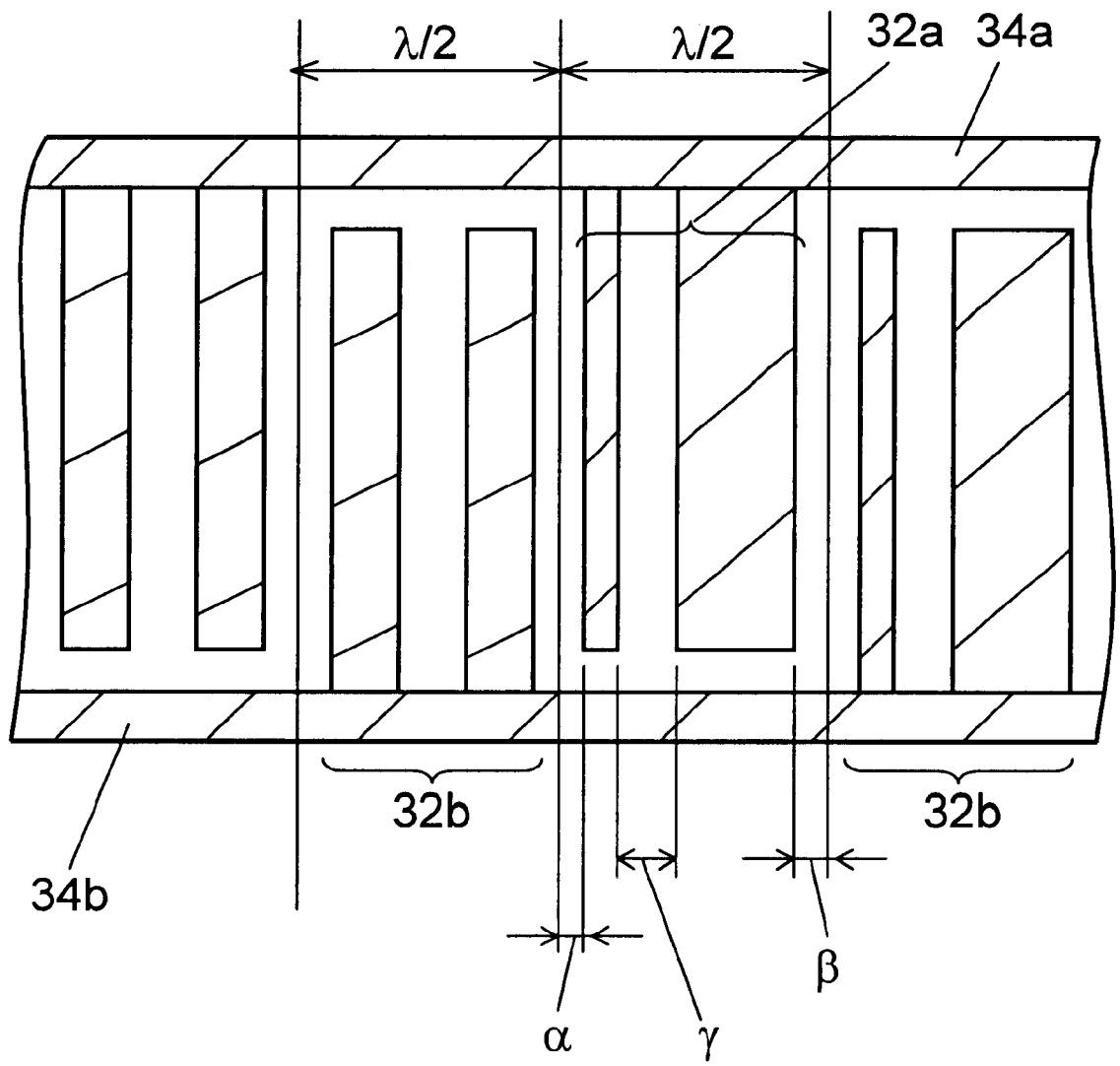
FIG. 11 is an enlarged top view of a main portion in FIG. 10.

FIG. 10 is a top view of a SAW filter according to exemplary embodiment 3 and FIG. 11 is an enlarged top view of a main portion of FIG. 10, in which input IDT 36 and output IDT 37 are formed on piezoelectric substrate 31.

Input IDT 36 and output IDT 37 are each constructed of interdigitated pairs of fingered electrodes 32a and 32b, and 33a and 33b, and lead electrodes 34a and 34b, and 35a and 35b, connecting their respective electrodes. Each pair of fingered electrodes 32a and 32b, and 33a and 33b, is formed of both fingered electrodes having different electrode widths and fingered electrodes having the same electrode width.

In FIG. 10, the small arrow indicates the direction in which the propagation directionality of the SAW is weak and the large arrow indicates the direction in which the propagation directionality of the SAW is strong.

Input IDT 36 and output IDT 37, as with exemplary embodiment 1, are made of aluminum or alloyed aluminum.

In input IDT 36, as shown in FIG. 11, the distance between the narrow fingered electrode and the wide fingered electrode of a pair of fingered electrodes 32a connected with lead electrode 34a is denoted by $\gamma$. Further, in the region including the pair of fingered electrodes 32a of regions obtained by equally dividing input IDT 36 such that a division corresponding to one-half wavelength of the SAW includes a pair of fingered electrodes 32a, the distance between the narrow fingered electrode and the edge of the region near the same is denoted by $\alpha$, and the distance between the wide fingered electrode and the edge of the region near the same is denoted by $\beta$.

Then, a couple of relations $\gamma>\alpha+\beta$ and $\alpha<\beta$ hold.

Also in the present exemplary embodiment 3, as with exemplary embodiment 1, the electrode width ratio is set to be larger than 1 or, preferably, to be in the range from 1.4 to less than 3.6. Further, the metallization ratio is set to be from 0.4 to 0.7 or, preferably, from 0.5 to 0.6. Further, it is preferred that the film thickness ratio (h/$\lambda$) of the fingered electrodes constituting input IDT 36 and output IDT 37 be set to be from 0.005 to 0.035.

Figure 12A:
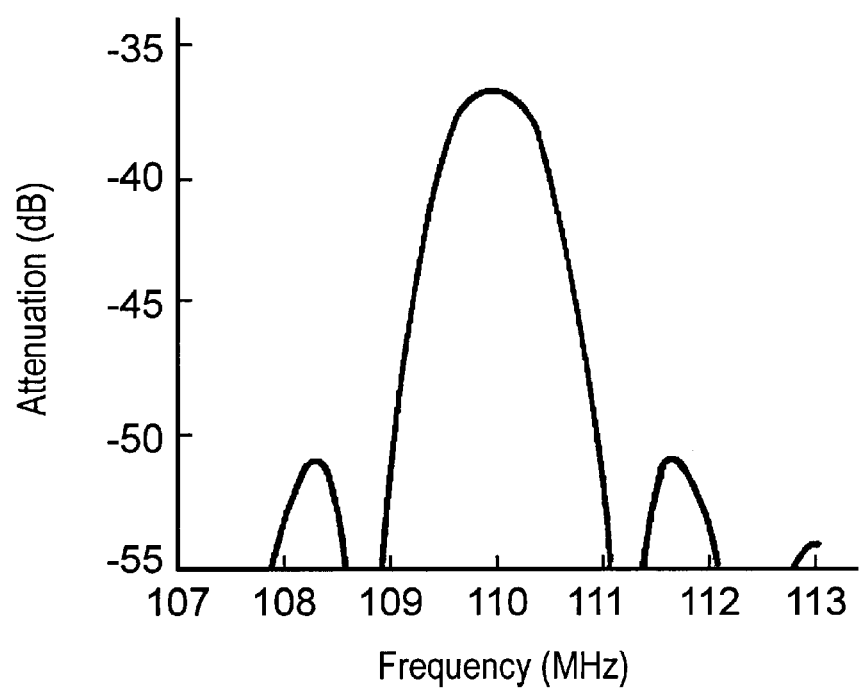
FIG. 12A is a frequency characteristic curve of electromechanical transduction in the direction in which the directionality of the SAW filter according to embodiment 3 of the invention is strong.
Figure 12B:
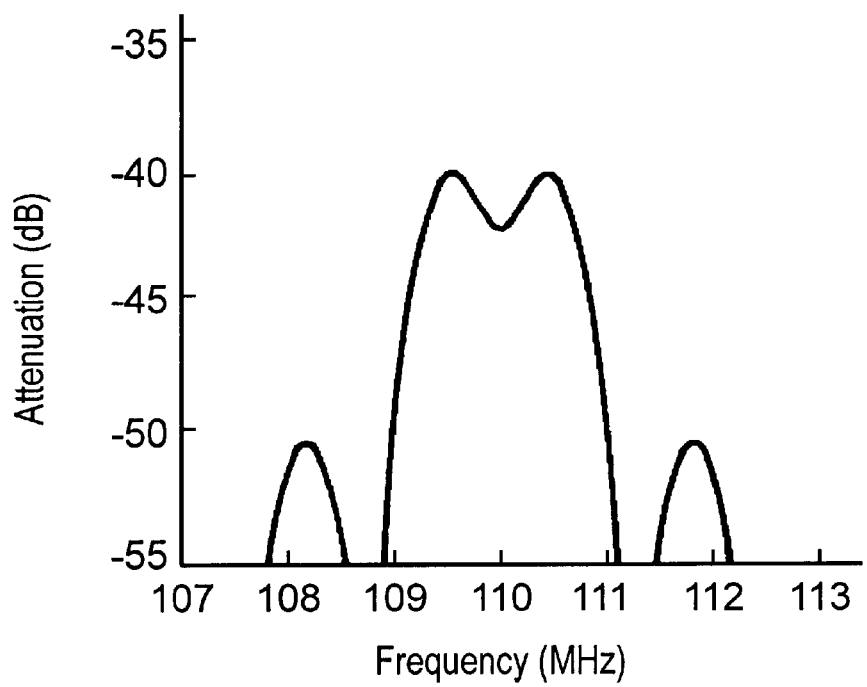
FIG. 12B is a frequency characteristic curve of electromechanical transduction in the direction in which the directionality of the SAW filter according to embodiment 3 of the invention is weak.

FIG. 12A shows frequency characteristics of electromechanical transduction, in a SAW filter made up of an IDT having 50 pairs of fingered electrodes being different in electrode width and 40 pairs of fingered electrodes being the same in electrode width, in the direction in which the directionality of a SAW filter is strong when it is specified such that the film thickness is 0.015, the electrode width ration is 3, and $\alpha=0.15\times(\lambda/16)$, $\beta=0.67\times(\lambda/16)$, and $\gamma=2\times(\lambda/$ 16). FIG. 12B shows frequency characteristics of electromechanical transduction in the same SAW filter in the direction in which the directionality is weak.

Figure 13A:
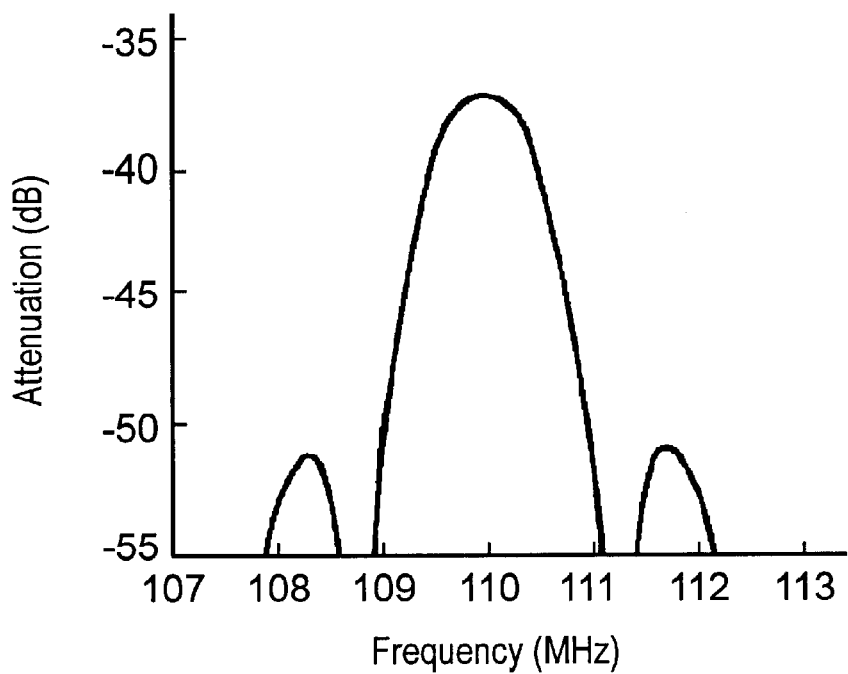
FIG. 13A is a frequency characteristic curve of electromechanical transduction in the direction in which the directionality of a SAW filter of a comparison example is strong.
Figure 13B:
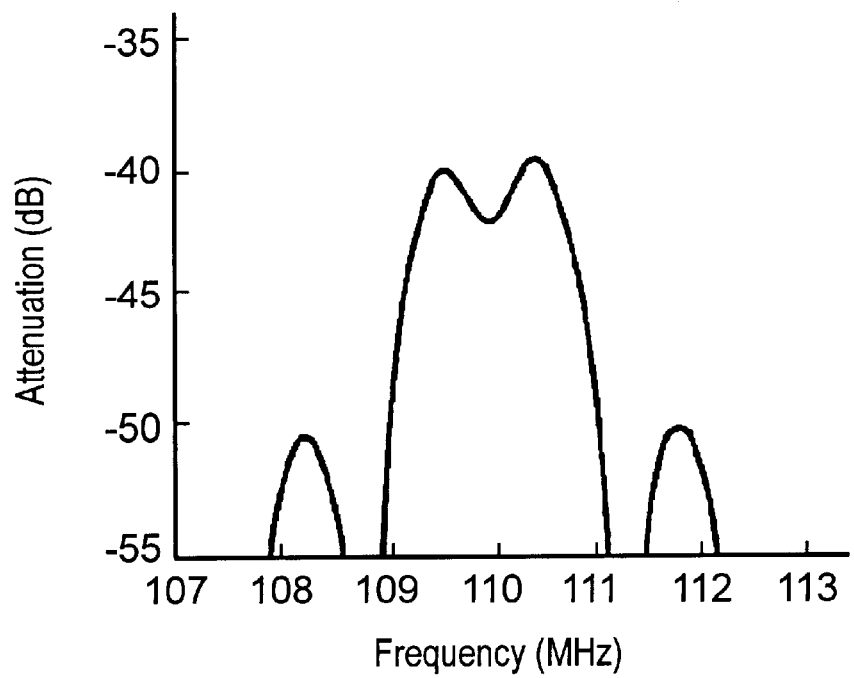
FIG. 13B is a frequency characteristic curve of electromechanical transduction in the direction in which the directionality of the SAW filter of the comparison example is weak.

FIG. 13A shows frequency characteristics of electromechanical transduction, in a SAW filter made up of an IDT having 50 pairs of fingered electrodes being different in electrode width and 40 pairs of fingered electrodes being the same in electrode width, in the direction in which the directionality of a SAW filter is strong, when it is specified such that the film thickness is 0.015, the electrode width ratio is 3, and $\alpha=\beta=0.41\times(\lambda/16)$, and $\gamma=2\times(\lambda/16)$. FIG. 13B shows frequency characteristics of electromechanical transduction of in same SAW filter in the direction in which the directionality is weak.

As understood from comparison of FIG. 12 with FIG. 13, when fingered electrodes being different in electrode width coexist with fingered electrodes being the same in electrode width, making such that $\alpha<\beta$ provides excellent symmetry and, therefore, decreases the variation in the pass-band and increases the stop-band attenuation.

Figure 14:
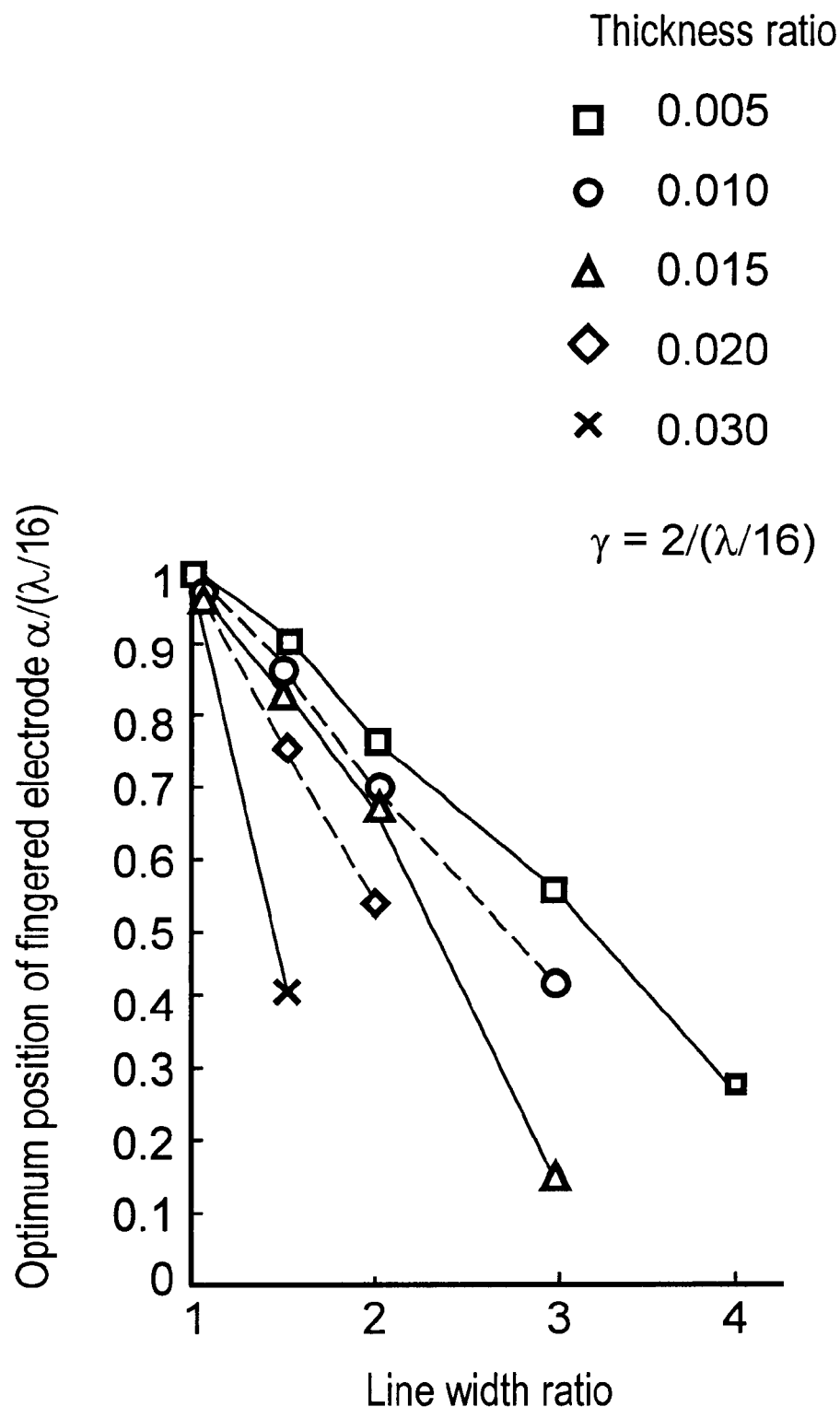
FIG. 14 is a curve showing relationship between electrode width ratio and optimum position of fingered electrodes $[\alpha/(\lambda/16)]$ of the SAW filter according to embodiment 3 of the invention.
Figure 15:
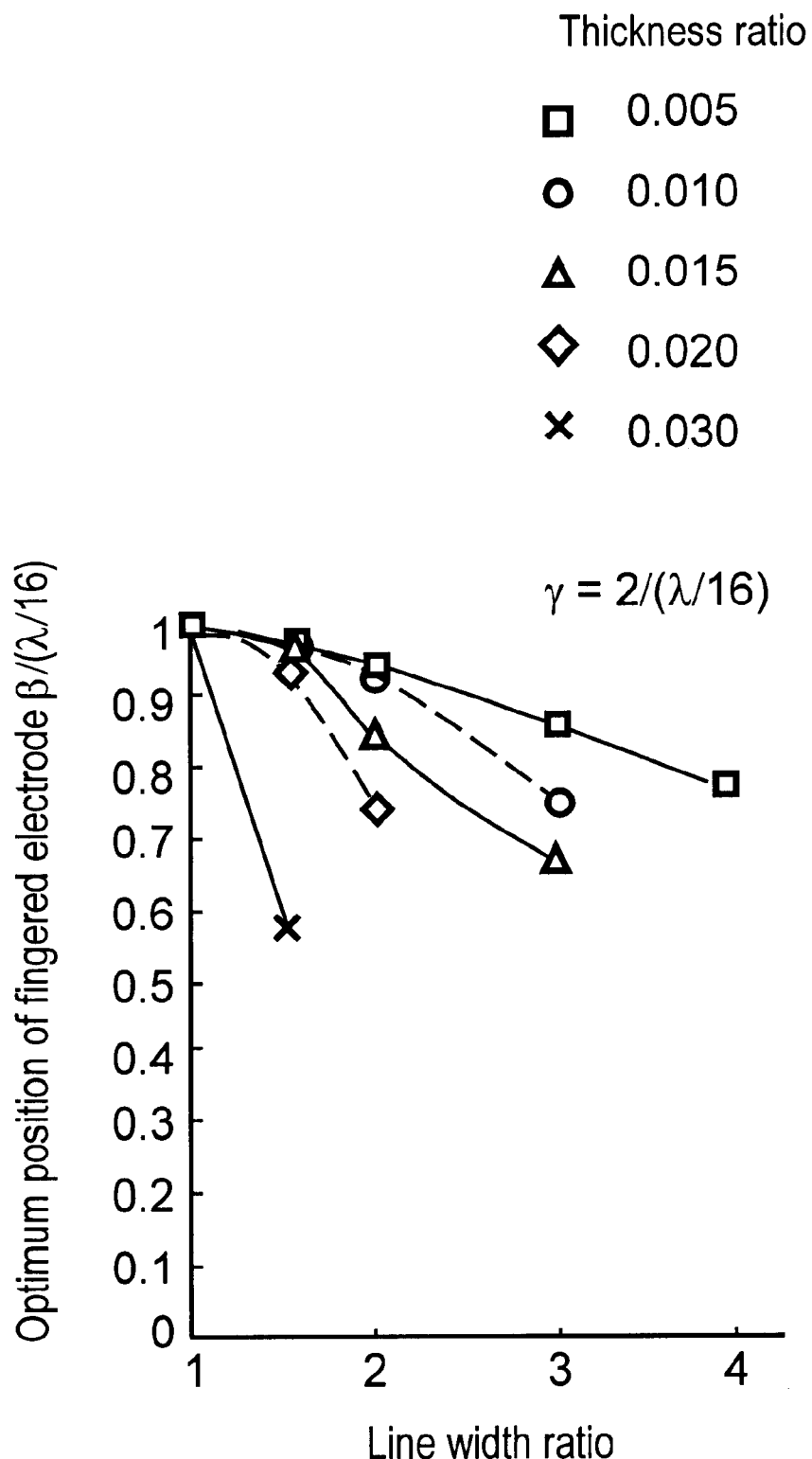
FIG. 15 is a curve showing relationship between electrode width ratio and optimum position of fingered electrodes $[\beta/(\lambda/16)]$ of the SAW filter according to embodiment 3 of the invention.

FIG. 14 and FIG. 15 show optimum values of $\alpha$ and $\beta$ with respect to film thickness ratios of 0.005, 0.010, 0.015, 0.020, and 0.030 of a SAW filter, which uses a '28°–42° rotated Y-cut' quartz substrate as piezoelectric substrate 31 and is made up of an IDT having 50 pairs of fingered electrodes being different in electrode width and 40 pairs of fingered electrode being the same in electrode width, and the center frequency of which is 110 MHz. In this case, a couple of relations $\gamma>\alpha+\beta$ and $\alpha<\beta$ hold.

(Exemplary Embodiment 4)

Figure 16:
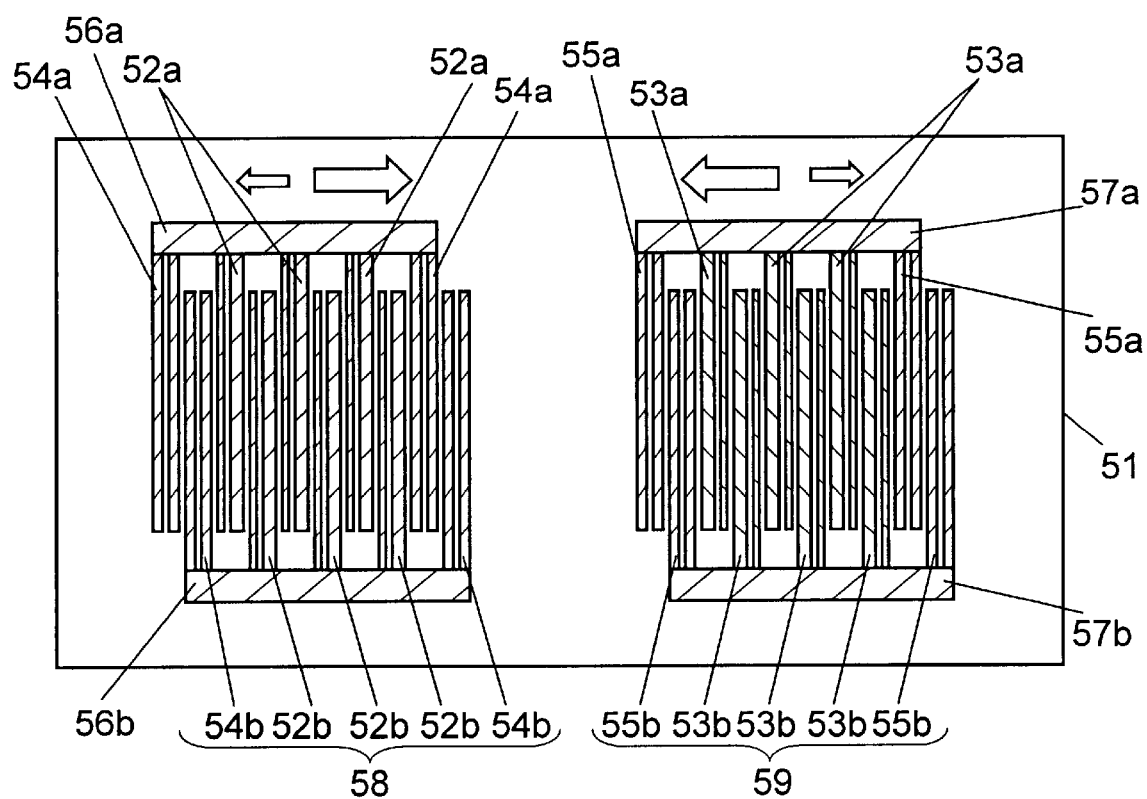
FIG. 16 is a top view of a SAW filter according to embodiment 4 of the invention.

FIG. 16 is a top view of a SAW filter according to exemplary embodiment 4. There are input IDT 58 and output IDT 59 formed on piezoelectric substrate 51.

Input IDT 58 is constructed of respectively interdigitated pairs of fingered electrodes 52a and 52b, and 54a and 54b, and output IDT 59 is constructed of respectively interdigitated pairs of fingered electrodes 53a and 53b, and 55a and 55b, while lead electrodes 56a and 56b, and 57a and 57b, connect their respective electrodes.

Further, inner fingered electrodes 52a and 52b of input IDT 58, and 53a and 53b, of output IDT 59 are made up of fingered electrodes being different in electrode width and fingered electrodes 54a and 54b, and 55a and 55b, at both ends of input IDT 58 and output IDT 59 are made up of fingered electrodes being the same in electrode width.

In FIG. 16, the small arrow indicates the direction in which the propagation directionality of the SAW is weak and the large arrow indicates the direction in which the propagation directionality of the SAW is strong.

Further, input IDT 58 and output IDT 59, as with embodiment 1, are made of aluminum or alloyed aluminum.

By changing the electrode width ratio of input IDT 58 and output IDT 59 as described above, a transversal type SAW filter having its unidirectionality controlled, insertion loss lowered, and characteristics in the pass-band improved can be obtained.

Further, by changing a distance between fingered electrodes in one IDT in accordance with the electrode width ratio; a SAW filter having better characteristics in the pass-band can be realized.

(Exemplary Embodiment 5)

Figure 17:
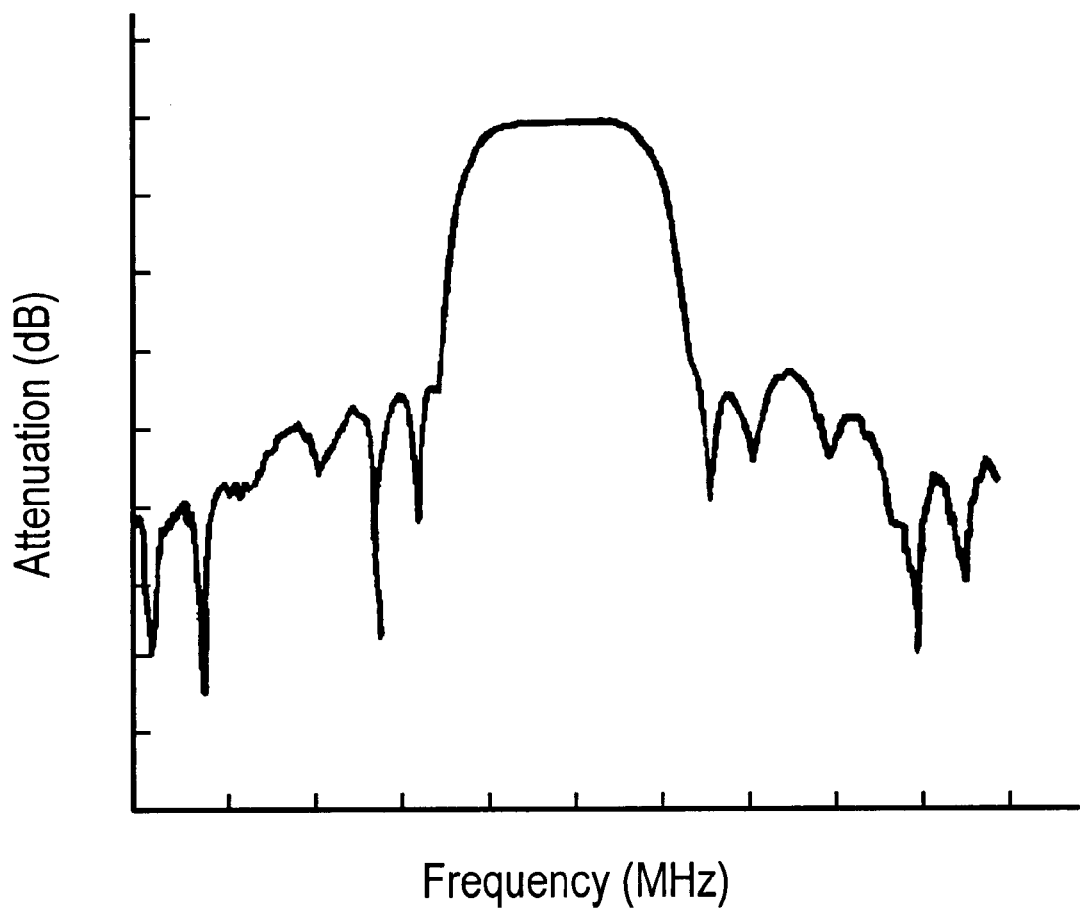
FIG. 17 is a frequency characteristic curve of a SAW filter according to an embodiment of the invention used for IF filter in CDMA-system mobile telephone.
Figure 18:
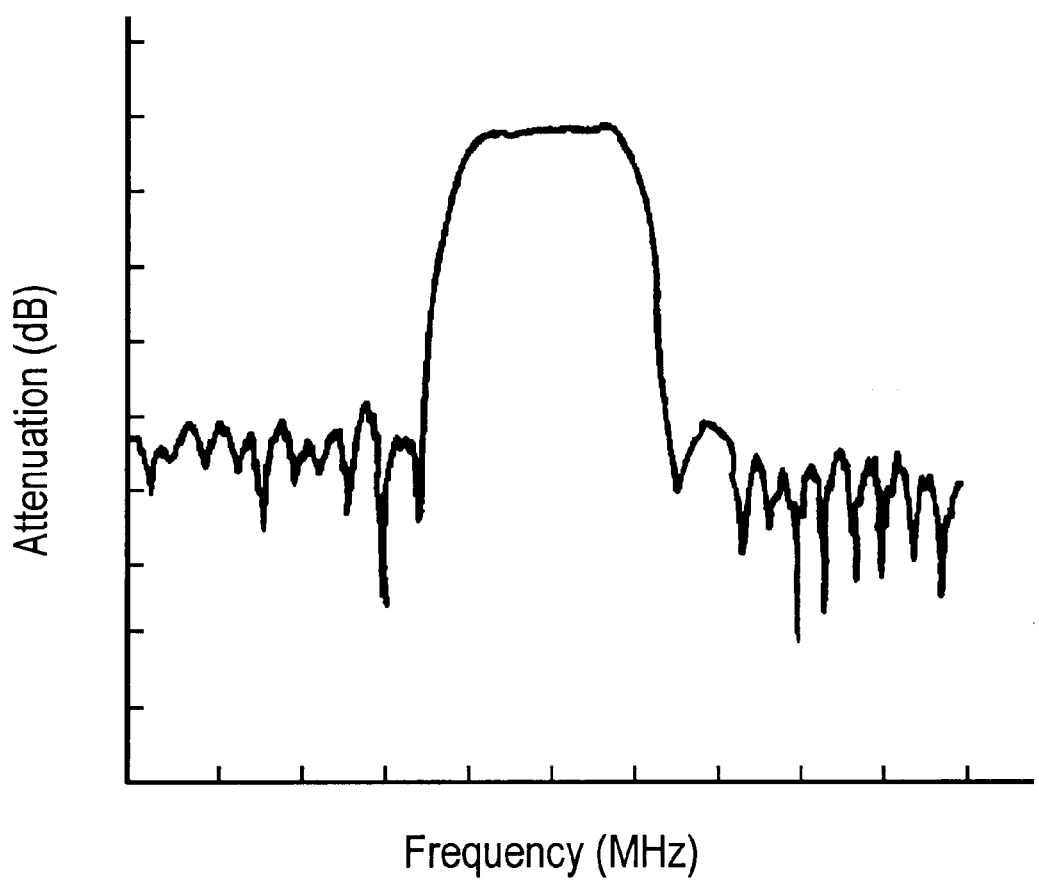
FIG. 18 is a frequency characteristic curve of a conventional SAW filter used for IF filter in CDMA-system mobile telephone.

FIG. 17 is a characteristic curve of an IF filter for a CDMA-system mobile telephone according to the present invention. The insertion loss at the center frequency is 8.17 dB. Further, for the sake of comparison, a characteristic of an IF filter of a CDMA-system mobile telephone with a conventional EWC-SPUDT is shown in FIG. 18. The insertion loss at the center frequency is 13.23 dB. The IF filter of the present invention has made an improvement of the insertion loss by 5 dB or so over the conventional IF filter and thus it is known that the filter of the invention is highly effective in reducing insertion loss.

(Exemplary Embodiment 6)

Figure 19:
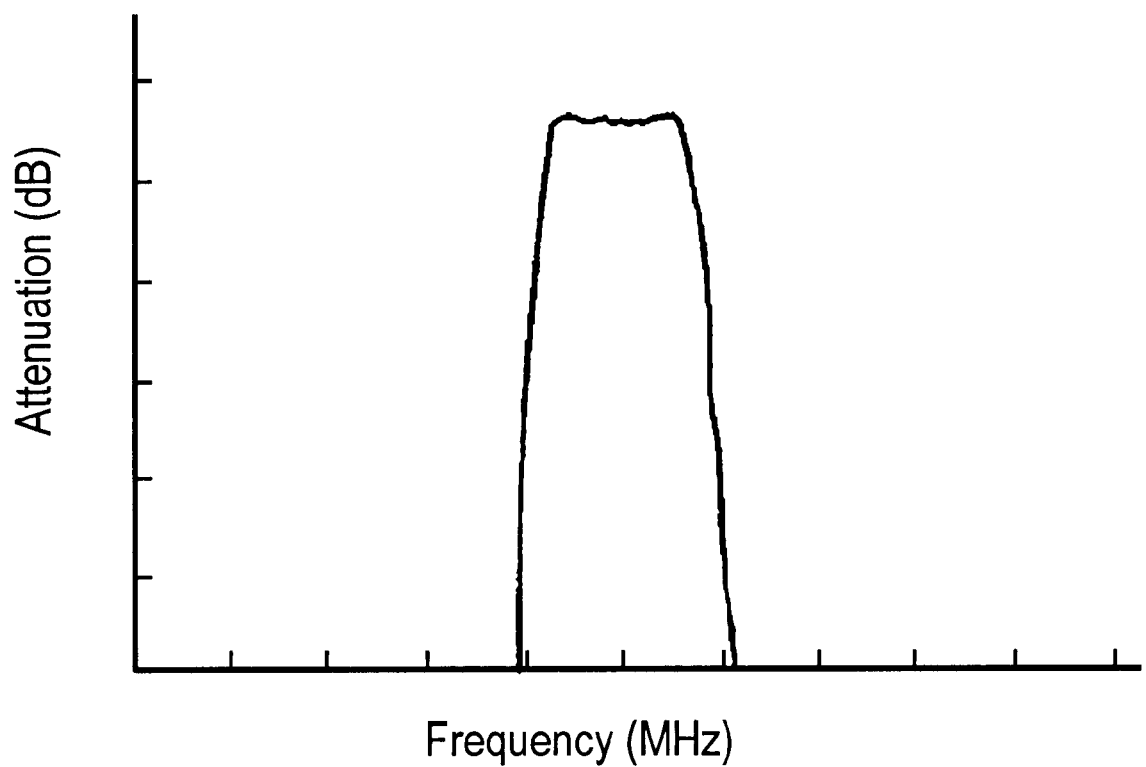
FIG. 19 is a frequency characteristic curve of a SAW filter according to embodiment 6 of the invention used for IF filter in CDMA-system mobile telephone.
Figure 20:
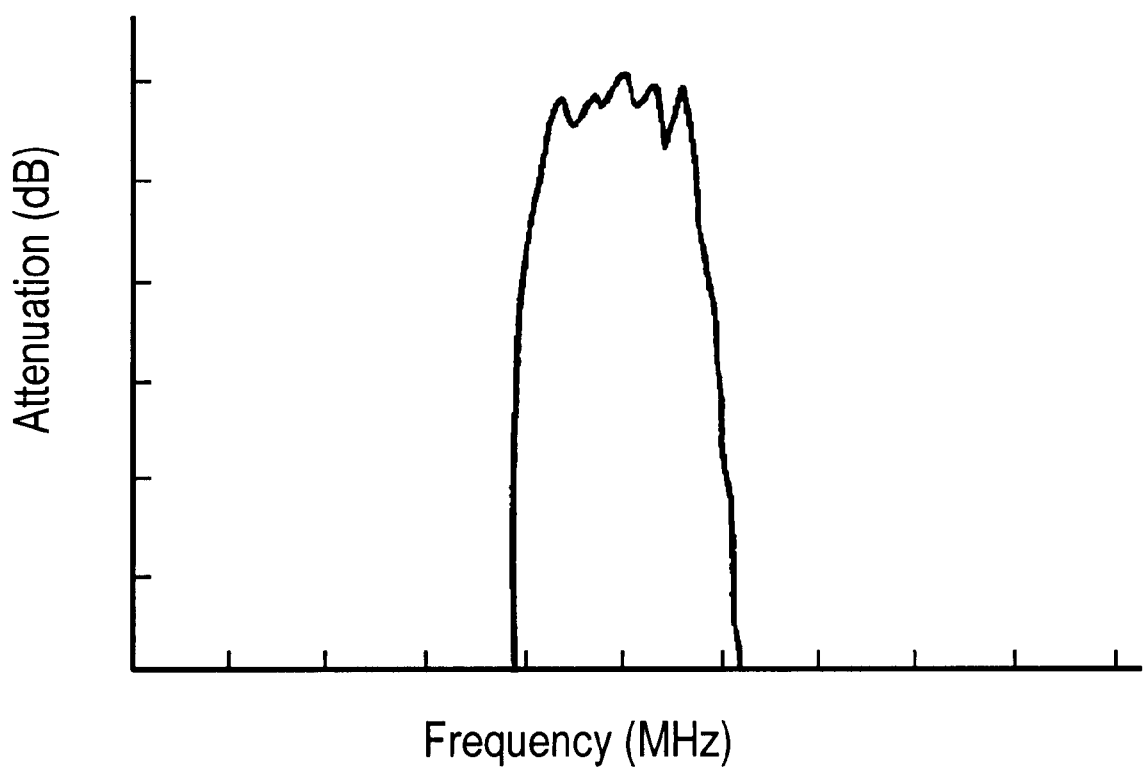
FIG. 20 is a frequency characteristic curve of a SAW filter, with unidirectionality thereof not controlled, according to an embodiment of the invention used for IF filter in CDMA-system mobile telephone.

FIG. 19 shows a characteristic of a SAW filter of which the electrode width ratio is 3 and the unidirectionality is controlled. This SAW filter produces such a small pass-band ripple with about 0.3 dB in addition to a low insertion loss and hence it is proved to be excellent in pass-band characteristics. For comparison, a characteristic of a SAW filter of which the electrode width ratio is 3 and the unidirectionality is not controlled is shown in FIG. 20. The ripple in the pass-band is 1.0 dB. The ripple in the pass-band in the filter controlled for unidirectionality can be reduced about 0.7 dB from that not controlled for the unidirectionality and thus it is known that this embodiment is highly effective in characteristics in the pass-band. The SAW filter controlled for the unidirectionality corresponds to the SAW filters shown in exemplary embodiments 2–4.

Controlling of the unidirectionality of SAW is also attained by forming one IDT of at least two kinds of pair of fingered electrodes being different in electrode width ratio.

(Exemplary Embodiment 7)

Figure 21:
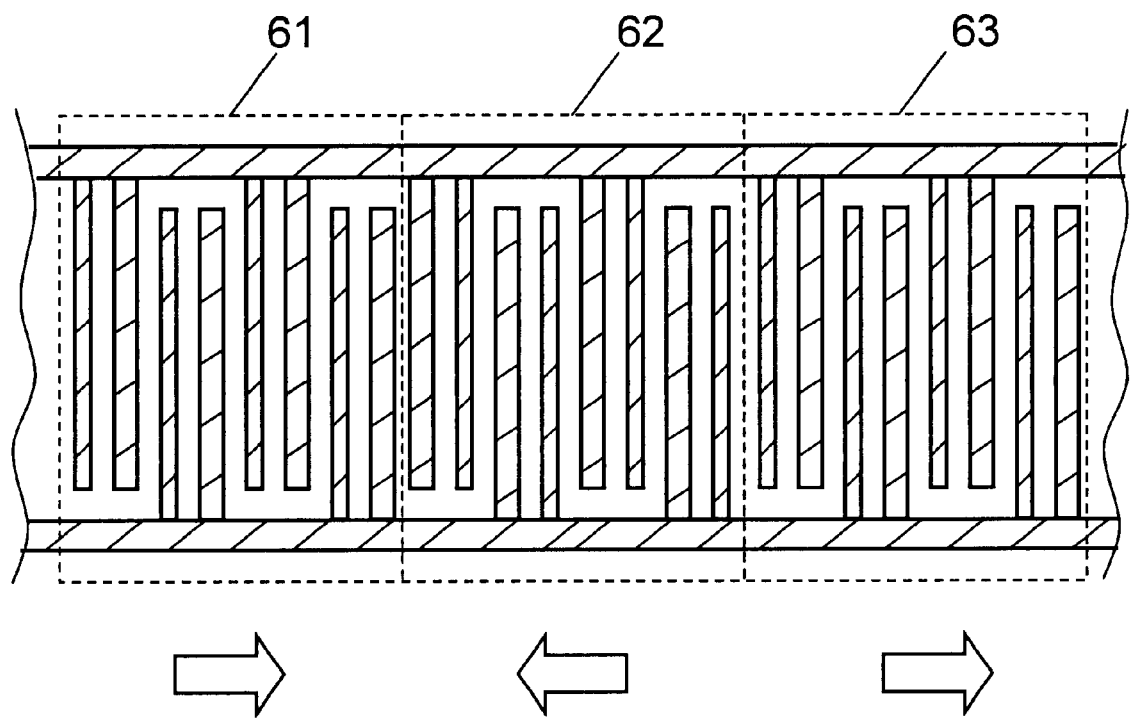
FIG. 21 is a partly enlarged top view of a portion of IDT according to embodiment 7 of the invention.

FIG. 21 is a partly enlarged top view of an IDT according to exemplary embodiment 7.

In one IDT, as shown in FIG. 7, the regions surrounded by broken lines 61 and 63 are given a unidirectionality toward the right in the drawing, while the region 62 is given a unidirectionality in reverse, i.e., toward the left. The IDT as a whole is given a unidirectionality toward the right.

Provision of such a region having a reversed unidirectionality in a region of one IDT allows a resonant cavity to be formed in the IDT. Thus, directionality of SAW is enhanced by resonance an d a small IDT can provide strong directionality. Therefore, those IDTs shown in exemplary embodiments 1–6 can further be made smaller and insertion loss thereof can further be reduced.

(Exemplary Embodiment 8)

Figure 22:
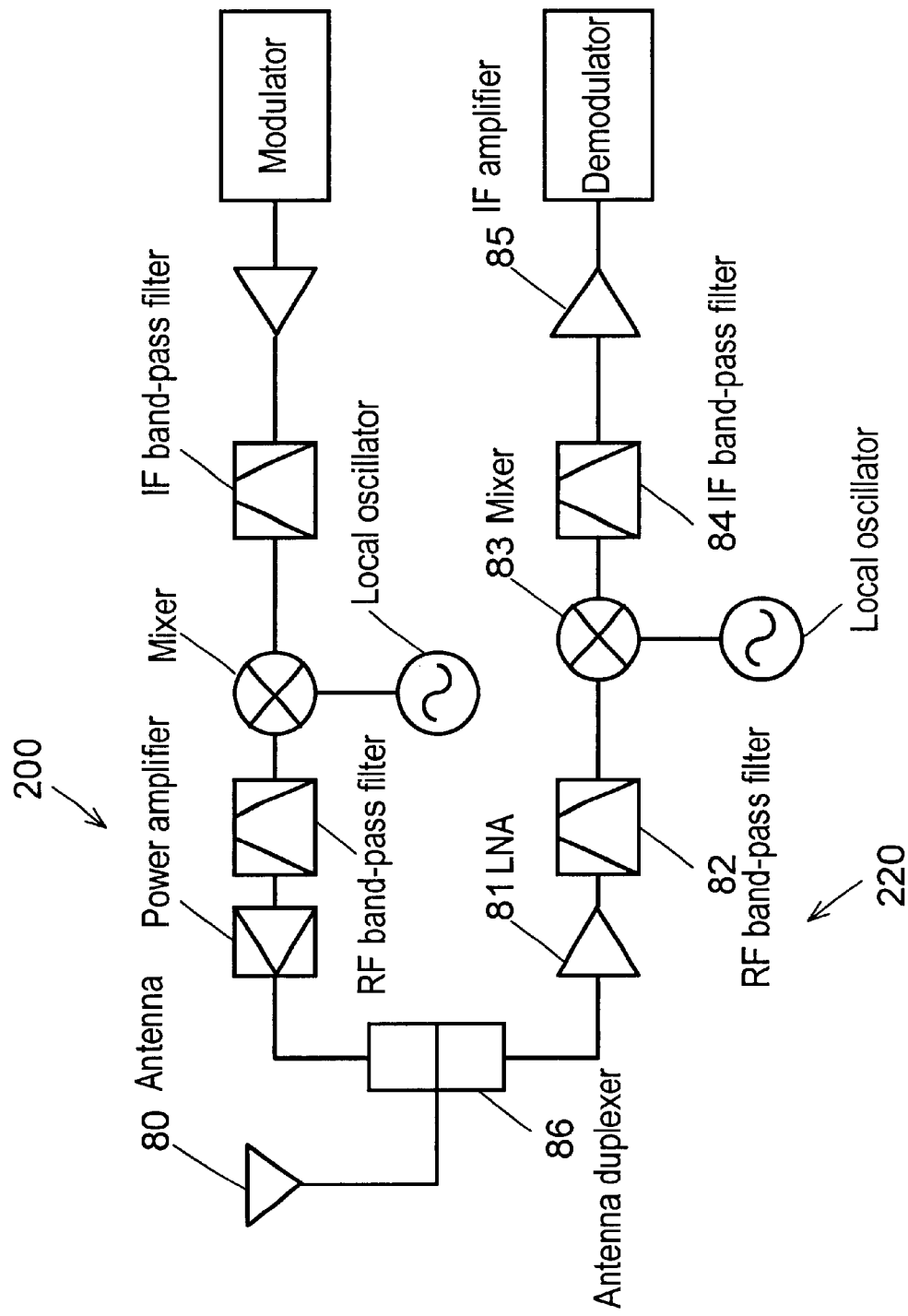
FIG. 22 is a block diagram of a transmit-receive circuit in a general radio communication apparatus.
Figure 23A:
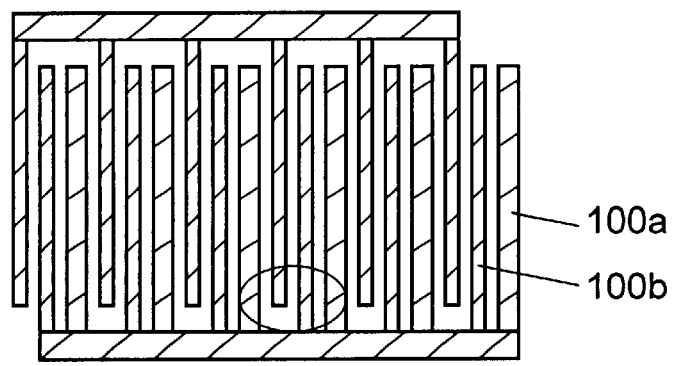
FIG. 23A is a top view of IDT of a conventional SAW filter.
Figure 23B:
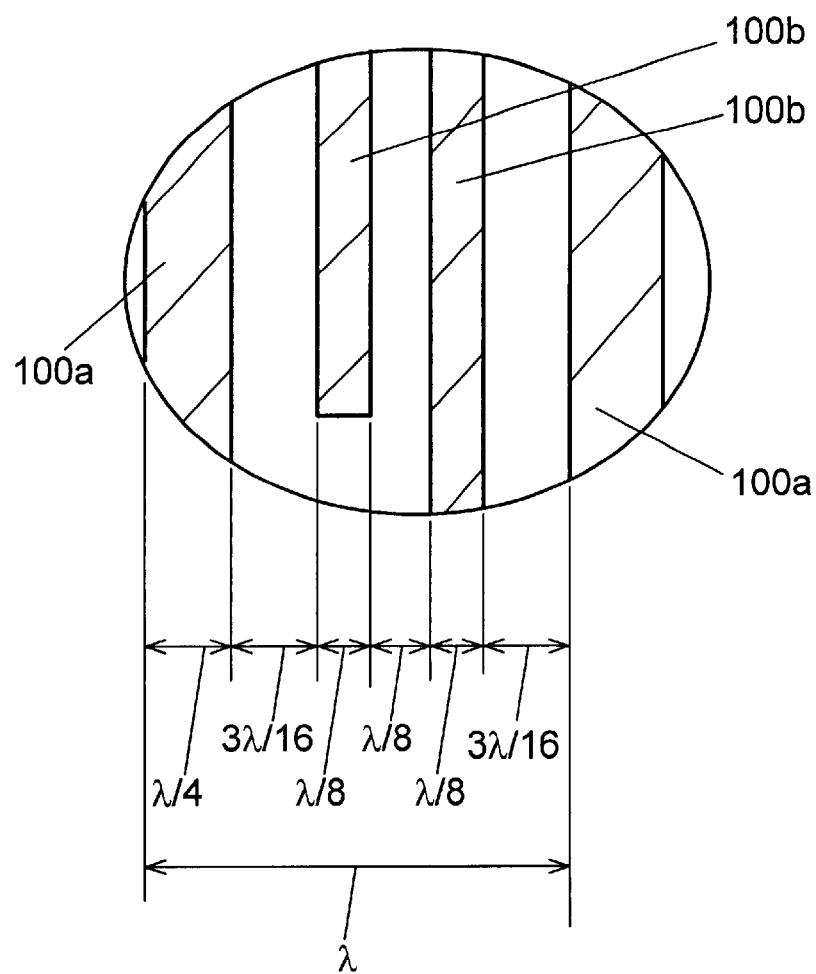
FIG. 23B is an enlarged top view of a portion surrounded by an oblong solid line in FIG. 23A.

FIG. 22 shows a block diagram of a transmit-receive circuit in a radio communication apparatus using a SAW filter shown in any of described embodiments 1–7.

While the SAW filter of the present invention can be used as IF band-pass filter in transmit and receive circuits, it is more frequently used as an IF band-pass filter in receive circuits. Therefore, it will be described as related to its use in a receive circuit.

The receive circuit 220 shown in FIG. 22 is a superheterodyne circuit. A received signal from antenna 80 is branched off by antenna duplexer 86 to be led into the receive circuit. The received signal is pass ed through Low Noise Amplifier (LNA) 81 and RF band-pass filter 82 and then mixed in mixer 83 with a local oscillation signal to be downconverted into an intermediate-frequency signal. SAW filter 84 of the invention is inserted between the stages of mixer 83 and IF amplifier 85 and used as an IF band-pass filter which allows the intermediate-frequency signal to be transmitted therethrough and eliminates unwanted signals therefrom. By the use of low-insertion-loss SAW filter 84 of the invention, the number of amplifying elements in IF amplifier 85 can be reduced. Further, power consumption in IF amplifier 85 can be kept low. Thus, a communication apparatus improved in terms of cost and performance can be obtained.

In SAW filter 84 described, a stabilized stop-band attenuation can be obtained by making at least one of the input terminal and output terminal in a balanced type.

According to the present invention as described in the foregoing, a unidirectional IDT is provided which is of a structure having four fingered electrodes different in electrode width disposed in the region on a piezoelectric substrate corresponding to one wavelength of SAW. This IDT can provide 1) sufficient unidirectionality, ii) reduced insertion loss because of its good SAW excitation efficiency, iii) excellent filter waveform both inside pass-band and outside pass-band, iv) and good temperature characteristics. By employing the same in communication apparatuses, high performance and cost reduction of the communication apparatuses can be realized.

What is claimed is:

1. A Surface Acoustic Wave (SAW) filter comprising:
   a piezoelectric substrate; and
   least two interdigital transducers (IDTs) formed of four fingered electrodes disposed in a region corresponding to one wavelength of a surface acoustic wave excited on said piezoelectric substrate,
   wherein at least one of said IDTs having at least one pair of fingered electrodes, each electrode of said one pair of fingered electrodes having a different electrode width to obtain propagation unidirectionality, electrode width ratio of said at least one pair of fingered electrodes of said IDT is different from electrode width ratio of at least one other pair of fingered electrodes of said IDT, and distance between electrodes of said at least one pair of fingered electrodes of said IDT is different from distance between electrodes of at least one other pair of fingered electrodes of said IDT.

2. The SAW filter according to claim 1, wherein
   said two IDTs are arranged to strengthen unidirectionalities toward each other.

3. The SAW filter according to claim 1, wherein
   said two IDTs are same in shape and symmetrical in position.

4. The SAW filter according to claim 1, wherein
   at least one IDT of said IDTs has at least two kinds of pair of fingered electrodes being different in electrode width ratio.

5. The SAW filter according to claim 1, wherein
   metallization ratio, defined by ratio between sum of widths of electrodes of fingered electrodes within a region corresponding to one-half wavelength of the surface acoustic wave and the one-half wavelength of the surface acoustic wave, of said fingered electrodes is between 0.4 and 0.7.

6. The SAW filter according to claim 1, wherein
   main component of the fingered electrode is aluminum or alloyed aluminum and film thickness ratio defined by ratio between thickness of the fingered electrode and wavelength of the surface acoustic wave is between 0.005 and 0.035.

7. A SAW filter according to claim 1, wherein said piezoelectric substrate is a 28°–42° rotated Y-cut quartz substrate.

8. A Surface Acoustic Wave (SAW) filter comprising:
   a piezoelectric substrate; and
   at least two interdigital transducers (IDTs) formed of four fingered electrodes disposed in a region corresponding to one wavelength of a surface acoustic wave excited on said piezoelectric substrate,
   wherein at least one of said IDTs having at least one pair of fingered electrodes, each electrode of said one pair of fingered electrodes having a different electrode width to obtain propagation unidirectionality, wherein a relation $\gamma>\alpha+\beta$ holds in a region including said pair of fingered electrodes, which is one of the regions obtained by equally dividing said IDT having said pair of fingered electrodes such that a division corresponding to one-half wavelength of the surface acoustic wave includes said pair of fingered electrodes, wherein $\gamma$ denotes distance between electrodes of said pair of fingered electrodes, $\alpha$ denotes distance between narrow fingered electrode of said pair of fingered electrodes and an edge of the region near the same, and $\beta$ denotes distance between the wider fingered electrode of said pair of fingered electrodes and an edge of the region near the same.

9. A Surface Acoustic Wave (SAW) filter comprising:

a piezoelectric substrate; and at least two interdigital transducers (IDTs) formed of four fingered electrodes disposed in a region corresponding to one wavelength of a surface acoustic wave excited on said piezoelectric substrate, wherein at least one of said IDTs having at least one pair of fingered electrodes, each electrode of said one pair of fingered electrodes having a different electrode width to obtain propagation unidirectionality, wherein, when said IDT have both a pair of fingered electrodes being different in electrode width and a pair of fingered electrodes being same in electrode width, a couple of relations $\gamma>\alpha+\beta$ and $\alpha<\beta$ hold in a region including said pair of fingered electrodes being different in electrode width, which is one of the regions obtained by equally dividing said IDT such that a division corresponding to one-half wavelength of the surface acoustic wave includes said pair of fingered electrodes, wherein $\gamma$ denotes distance between electrodes of said pair of fingered electrodes, $\alpha$ denotes distance between narrow fingered electrode of said pair of fingered electrodes and an edge of the region near the same, and $\beta$ denotes distance between wider fingered electrode of said pair of fingered electrodes and an edge of the region near the same.

10. A Surface Acoustic Wave (SAW) filter comprising:

a piezoelectric substrate; and least two interdigital transducers (IDTs) formed of four fingered electrodes disposed in a region corresponding to one wavelength of a surface acoustic wave excited on said piezoelectric substrate, wherein at least one of said IDTs having at least one pair of fingered electrodes, each electrode of said one pair of fingered electrodes having a different electrode width to obtain propagation unidirectionality, wherein at least one of said IDTs is a unidirectional transducer, and fingered electrodes therein are arranged such that unidirectionality in a direction is strengthened at least in one region of said unidirectional transducer, and unidirectionality in opposite direction to said direction is strengthened at least in one region other than said region.

11. A Surface Acoustic Wave (SAW) filter comprising:

a piezoelectric substrate; and at least two interdigital transducers (IDTs) formed of four fingered electrodes disposed in a region corresponding to one wavelength of a surface acoustic wave excited on said piezoelectric substrate, wherein at least one of said IDTs having at least one pair of fingered electrodes, each electrode of said one pair of fingered electrodes having a different electrode width to obtain propagation unidirectionality, wherein at least one IDT of said IDTs has at least two kinds of pair of fingered electrodes being different in electrode width ratio and distances between electrodes of the two kinds of pair of fingered electrodes are different from each other.

12. A communication apparatus having a surface acoustic wave (SAW) filter disposed between the stages of a frequency mixer and an Intermediate Frequency (IF) amplifier, wherein SAW filter comprises:

a piezoelectric substrate; and at least two interdigital transducers (IDTs) formed of four fingered electrodes disposed in a region corresponding to one wavelength of a surface acoustic wave excited on said piezoelectric substrate, and at least one of said IDTs having at least one pair of fingered electrodes, each electrode of said one pair of fingered electrodes having a different electrode width to obtain propagation unidirectionality, electrode width ratio of said at least one pair of fingered electrodes of said IDT is different from electrode width ratio of at least one other pair of fingered electrodes of said IDT, and distance between electrodes of said at least one pair of fingered electrodes of said IDT is different from distance between electrodes of at least one other pair of fingered electrodes of said IDT.

* * * * *

UNITED STATES PATENT AND TRADEMARK OFFICE
CERTIFICATE OF CORRECTION

PATENT NO. : 6,469,598 B2
DATED : October 22, 2002
INVENTOR(S) : Shigeru Tsuzuki et al.

It is certified that error appears in the above-identified patent and that said Letters Patent is hereby corrected as shown below:

<u>Column 10,</u>
Line 16, before "least", insert -- at --.

<u>Column 11,</u>
Line 44, before "least", insert -- at --.

Signed and Sealed this

Sixth Day of May, 2003

JAMES E. ROGAN
*Director of the United States Patent and Trademark Office*